(12) United States Patent
Nakiboğlu et al.

(10) Patent No.: US 11,835,870 B2
(45) Date of Patent: Dec. 5, 2023

(54) TEMPERATURE CONDITIONING SYSTEM

(71) Applicant: ASML NETHERLANDS B.V., Veldhoven (NL)

(72) Inventors: Güneş Nakiboğlu, Eindhoven (NL); Nicholas Peter Waterson, Veldhoven (NL); Remco Van De Meerendonk, 's-Hertogenbosch (NL); Steve Gregory Brust, Eindhoven (NL); Dirk Martinus Gerardus Petrus Wilhelmus Jakobs, Vortum-Mullem (NL); Shravan Kottapalli, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/627,720

(22) PCT Filed: Jun. 18, 2020

(86) PCT No.: PCT/EP2020/066871
§ 371 (c)(1),
(2) Date: Jan. 17, 2022

(87) PCT Pub. No.: WO2021/013441
PCT Pub. Date: Jan. 28, 2021

(65) Prior Publication Data
US 2022/0350265 A1    Nov. 3, 2022

(30) Foreign Application Priority Data

Jul. 19, 2019   (EP) ................................... 19187169
Nov. 29, 2019   (EP) ................................... 19212462

(51) Int. Cl.
*G03F 7/00*        (2006.01)
(52) U.S. Cl.
CPC ............................ *G03F 7/70891* (2013.01)

(58) Field of Classification Search
CPC ............. G03F 7/70875; G03F 7/70891; G03F 7/709
See application file for complete search history.

(56) References Cited

U.S. PATENT DOCUMENTS

| 2008/0143001 A1 | 6/2008 | Heuvel et al. |
| 2010/0045950 A1* | 2/2010 | Kemper ............ B01D 19/0021 |
| | | 355/30 |
| 2010/0170222 A1 | 7/2010 | Rogers et al. |

(Continued)

FOREIGN PATENT DOCUMENTS

| CN | 109356959 | 2/2019 |
| DE | 3030259 | 2/1982 |

(Continued)

OTHER PUBLICATIONS

International Search Report and Written Opinion issued in corresponding PCT Patent Application No. PCT/EP2020/066871, dated Sep. 25, 2020.

(Continued)

*Primary Examiner* — Deoram Persaud
(74) *Attorney, Agent, or Firm* — Pillsbury Winthrop Shaw Pittman, LLP

(57) ABSTRACT

A passive flow induced vibration reduction system for use in a temperature conditioning system that controls the temperature of at least one component within a lithographic apparatus. This FIV reduction system includes: a conduit that provides a flow path for a liquid through the system; a liquid filled cavity in fluid connection with the conduit, wherein the fluid connection is provided via one or more openings in the wall of the conduit; a membrane configured such that it separates the liquid in the liquid filled cavity from a gas at a substantially ambient pressure and the membrane is configured such that compliance of the membrane reduces at least low frequency flow induced vibrations in the liquid flowing through the conduit; and an end-stop (Continued)

located on the gas side of the membrane, wherein the end-stop is configured to limit an extent of deflection of the membrane.

20 Claims, 14 Drawing Sheets

(56) References Cited

U.S. PATENT DOCUMENTS

2018/0245337 A1* 8/2018 Malsch .................. E04H 9/16
2018/0299796 A1   10/2018 Nakiboglu et al.

FOREIGN PATENT DOCUMENTS

| EP | 1843206 | 10/2007 |
| JP | H8312834 | 11/1996 |
| JP | H10252600 | 9/1998 |
| JP | 2000320782 | 11/2000 |
| JP | 2001115950 | 4/2001 |
| JP | 2002089775 | 3/2002 |
| JP | 2005163564 | 6/2005 |
| JP | 2017518537 | 7/2017 |
| WO | 2012013559 | 2/2012 |

OTHER PUBLICATIONS

Anonymous, "Liquid Dynamics Decoupler", Research Disclosure, vol. 663, No. 30, p. 706 (Jul. 1, 2019).

Anonymous, "Research Disclosure", Research Disclosure, vol. 631, No. 26, p. 876 (Nov. 1, 2016).

Office Action issued in corresponding Japanese Patent Application No. 2022-503551, dated Apr. 4, 2023.

* cited by examiner

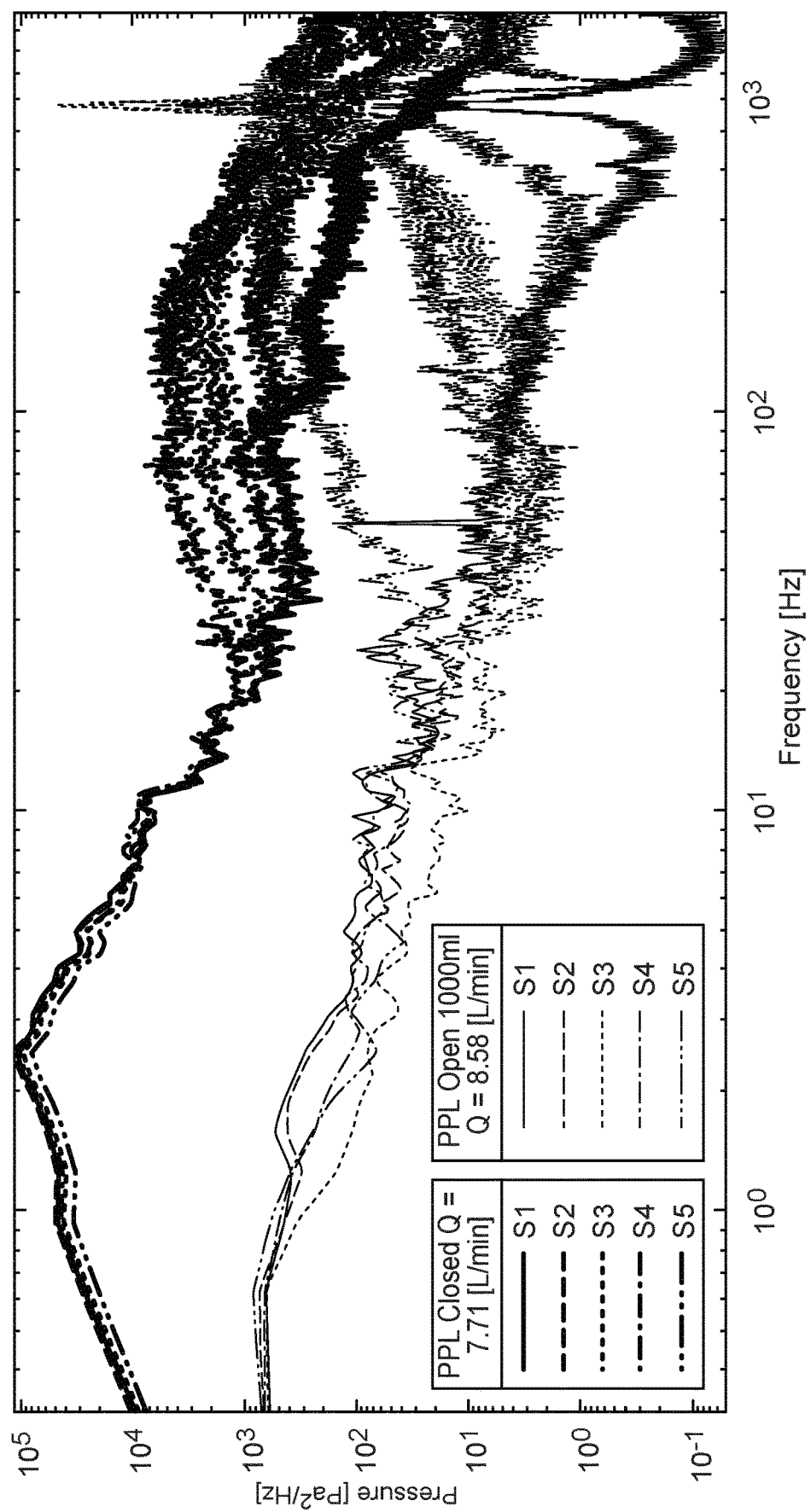

- - - - Rigid Theory ($f_n$ = 358.80 [Hz])
- - - - 6.5 [mm] ALU ($f_n$ = 129.65 [Hz])
- - - - 2 X 2 [mm] SS ($f_n$ = 34.49 [Hz])
——— 1 [mm] SS ($f_n$ = 17.39 [Hz])
- - - - 2 [mm] SS ($f_n$ = 48.82 [Hz])
- - - - 3 [mm] SS ($f_n$ = 87.63 [Hz])
——— 4 [mm] SS ($f_n$ = 129.93 [Hz])

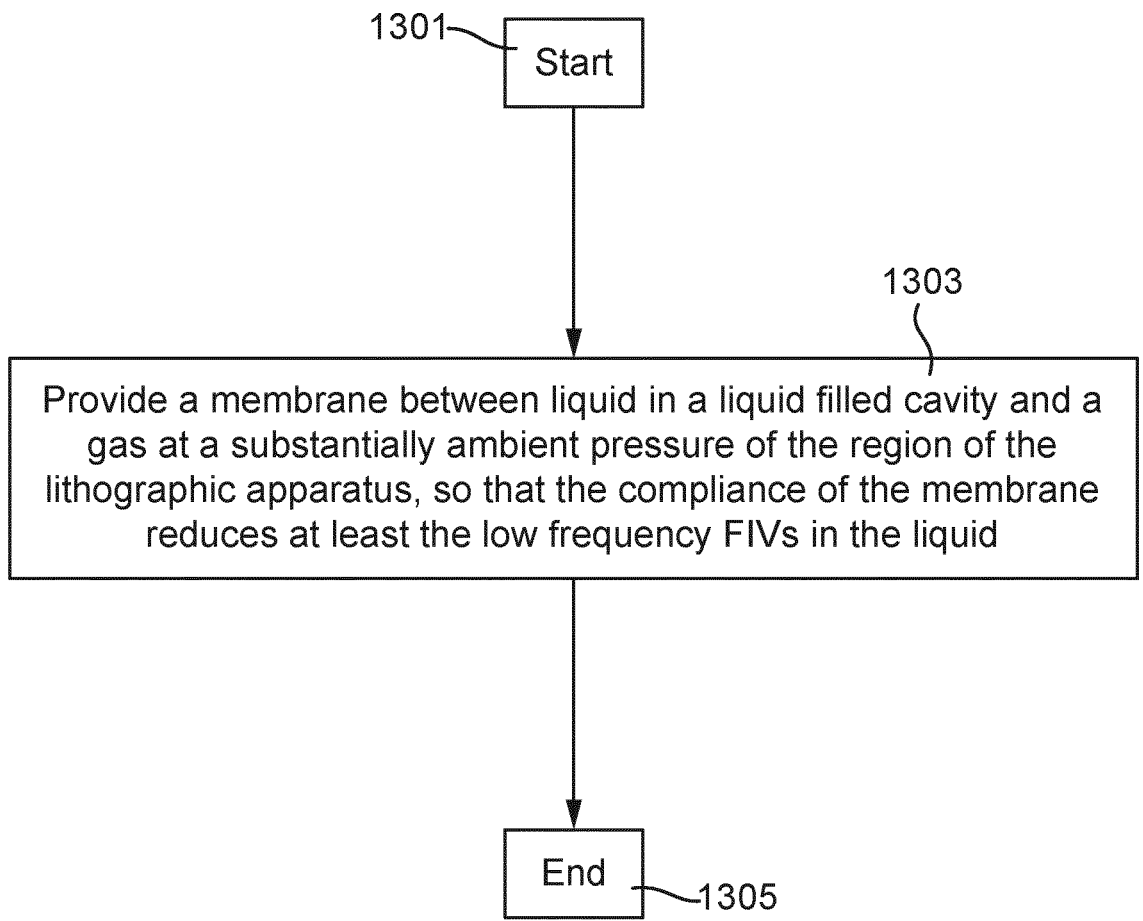

TEMPERATURE CONDITIONING SYSTEM

CROSS-REFERENCE TO RELATED APPLICATIONS

This application is the U.S. national phase entry of PCT Patent Application No. PCT/EP2020/066871 which was filed on Jun. 18, 2020, which claims the benefit of priority of European Patent Application No. 19187169.8 which was filed on Jul. 19, 2019, and of European Patent Application No. 19212462.6 which was filed on Nov. 29, 2019 and which are incorporated herein in their entireties by reference.

FIELD

The present invention relates to a temperature conditioning system for a lithographic apparatus. More particularly, the techniques disclosed herein relate to the provision of a flow induced vibration reduction system in a temperature condition system. The flow induced vibration reduction system reduces the fluid induced vibrations in the temperature conditioning system.

BACKGROUND

A lithographic apparatus is a machine that applies a desired pattern onto a substrate, usually onto a target portion of the substrate. A lithographic apparatus can be used, for example, in the manufacture of integrated circuits (ICs). In the manufacture of ICs, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction A theoretical estimate of the limits of pattern printing can be given by the Rayleigh criterion for resolution as shown in equation (1):

$$CD = k_1 * \frac{\lambda}{NA} \qquad (1)$$

where $\lambda$ the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus reduce the minimum printable size, it has been proposed to use an extreme ultraviolet (EUV) radiation source. EUV radiation is electromagnetic radiation having a wavelength within the range of 4-20 nm, for example within the range of 13-14 nm, for example within the range of 4-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as droplets of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In a lithographic apparatus there is a need to provide a temperature conditioning system to ensure that all components of the system are maintained at an appropriate temperature. Temperature changes can cause the size of components to change, as well as other effects that can introduce errors into the performance system. There is a general need to improve the provision of a temperature conditioning system in a lithographic apparatus, in particular for an EUV lithographic apparatus that has high sensitivity to inaccuracies in temperature conditioning.

SUMMARY

According to a first aspect of the invention, there is provided a passive flow induced vibration, FIV, reduction system for use in a temperature conditioning system that controls the temperature of at least one component within an apparatus, for example, a lithographic apparatus, the FIV reduction system comprising: a conduit that provides a flow path for a liquid through the FIV reduction system; a liquid filled cavity in fluid connection with the conduit, wherein the fluid connection is provided via one or more openings in the wall of the conduit; a membrane configured such that it separates the liquid in the liquid filled cavity from a gas at a substantially ambient pressure and the membrane is configured such that, in use, the compliance of the membrane reduces at least the low frequency FIVs in the liquid flowing through the conduit; and an end-stop located on the gas side of the membrane, wherein the end-stop is configured to limit the extent of deflection of the membrane.

Preferably, the low frequency FIVs in the liquid are FIVs that have a frequency of 30 Hz or less.

Preferably, in use, the liquid flowing through the conduit is water.

Preferably, in use, the gas is air, nitrogen, or carbon tetrafluoride.

Preferably, the FIV reduction system further comprises a gas chamber, wherein the gas on the gas side of the membrane is comprised by the gas chamber.

Preferably, the volume of the gas in the gas chamber is at least 2 mL, more preferably at least 100 mL, and even more preferably at least 1000 mL.

Preferably, the end-stop is located inside the gas chamber.

Preferably, a side of the gas chamber, that is an opposing end of the gas chamber to the membrane, comprises the end-stop.

Preferably, the FIV reduction system further comprises one or more additional membranes positioned side by side to the first membrane, wherein each membrane is a membrane of the same liquid filled cavity.

Preferably, each of the plurality of membranes has substantially the same compliance.

Preferably, each of the plurality of membranes has a different compliance.

Preferably, the end-stop comprises one or more through openings.

Preferably, the end-stop comprises no through openings.

Preferably, the end-stop is a flat plate substantially parallel to the plane of the membrane.

Preferably, the shape of the end-stop matches the displacement profile of the membrane.

According to a second aspect of the invention, there is provided a temperature conditioning system arranged to control the temperature of at least one component within an apparatus, e.g., a lithographic apparatus, the temperature conditioning system comprising: a component that is arranged to be temperature controlled by a liquid flowing through the component; and at least one FIV reduction system according to the first aspect of the invention.

Preferably, the component is any of a sensor frame for a projection optics box, a lens, a mirror, and a substrate stage.

Preferably, in use, the flow of liquid through the conduit of each FIV reduction system is in line with the flow of the liquid through the component.

Preferably, the temperature conditioning system comprises at least one FIV reduction system on an inlet side of the component and/or at least one FIV reduction system on an outlet side of the component.

Preferably, the temperature conditioning system further comprises one or more flexible conduits and/or one or more rigid conduits that are each arranged to provide a flow path for liquid in the temperature conditioning system.

According to a third aspect of the invention, there is provided a lithographic apparatus comprising a temperature conditioning system according to the second aspect of the invention.

According to a fourth aspect of the invention, there is provided a method of reducing flow induced vibrations, FIVs, in a liquid of a temperature conditioning system that controls the temperature of a component in an apparatus, the method comprising: providing a membrane between liquid in a liquid filled cavity and a gas at a substantially ambient pressure of the region of the lithographic apparatus, so that the compliance of membrane reduces at least the low frequency FIVs in the liquid; wherein the method is performed by a FIV reduction system according to the first aspect of the invention.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a known lithographic apparatus.

FIG. 2 schematically shows pressure zones of a known lithographic apparatus.

Figure 6A:
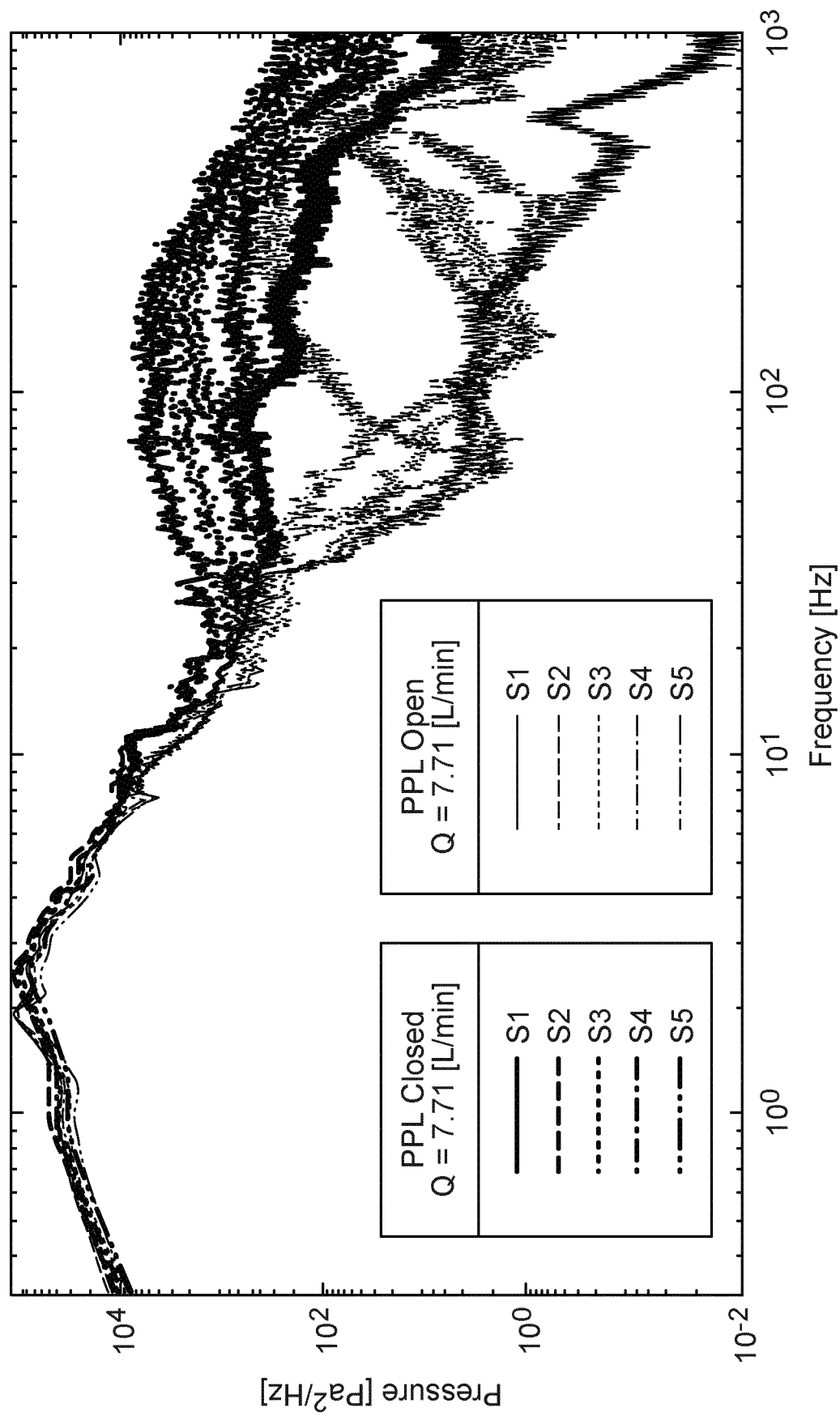
Figure 6B:
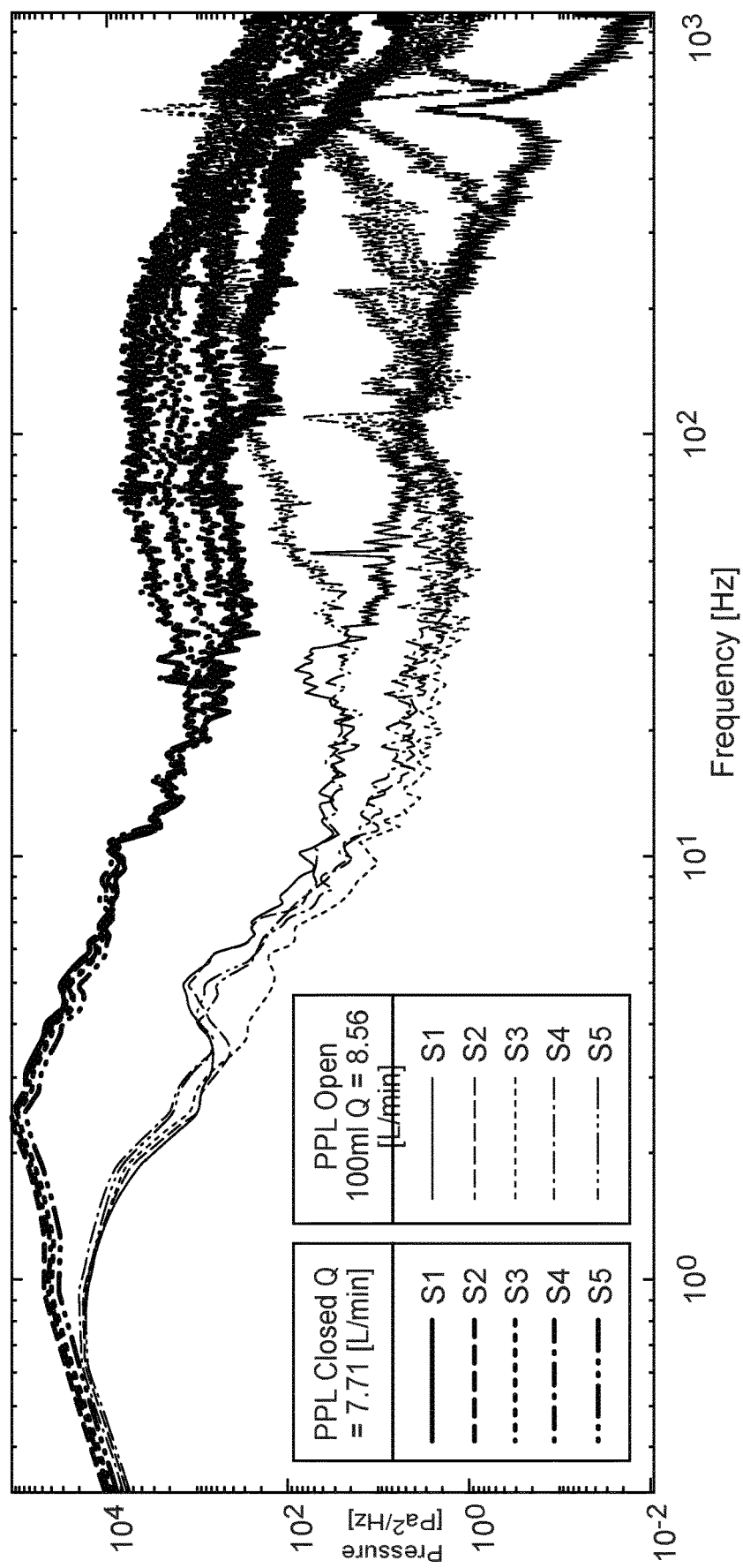

FIGS. 6A, 6B, and 6C shows results that demonstrate the advantages of systems according to first, second and third embodiments.

Figure 7:
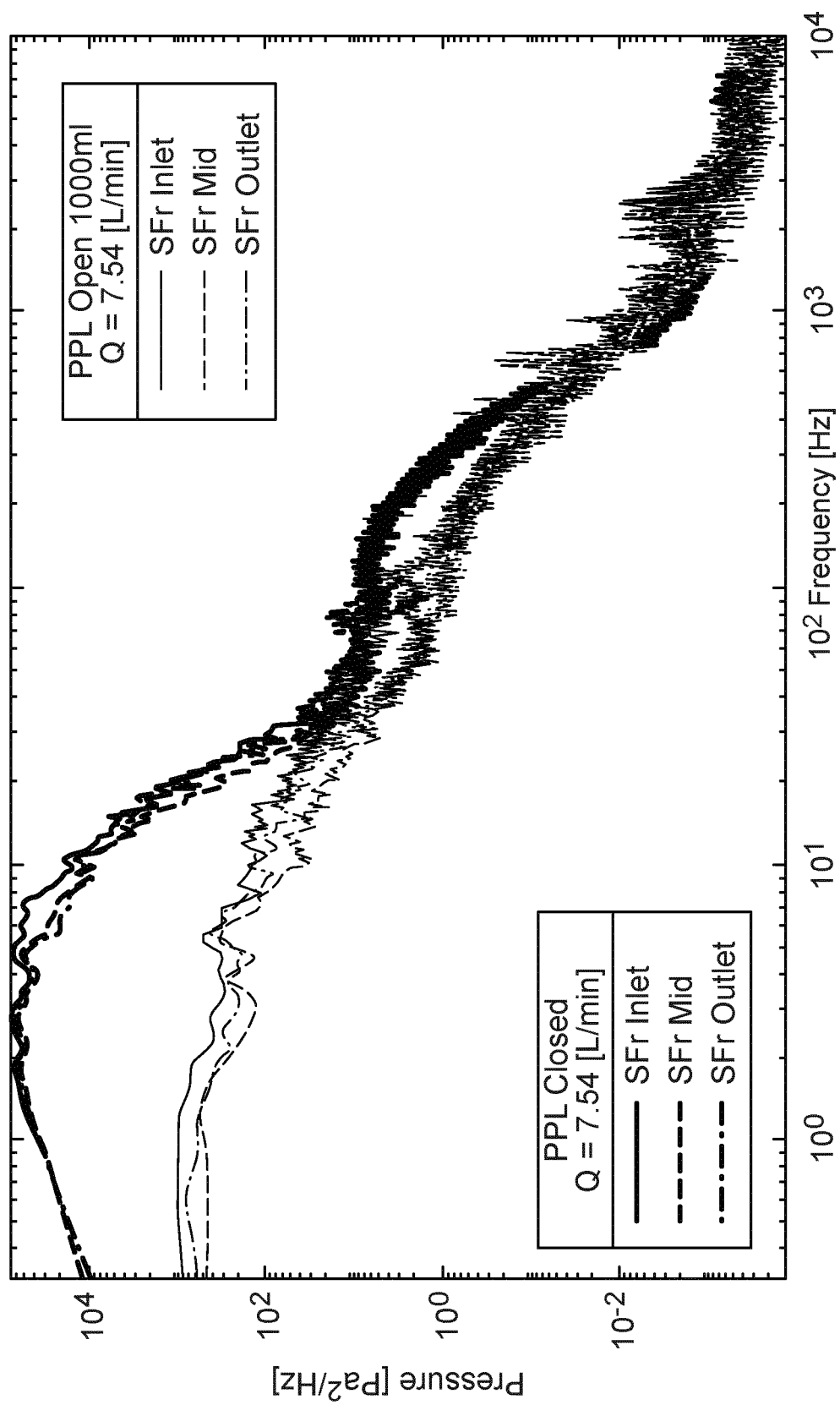

FIG. 7 shows results that demonstrate the advantages of a system according to first, second, and third embodiments.

Figure 8:
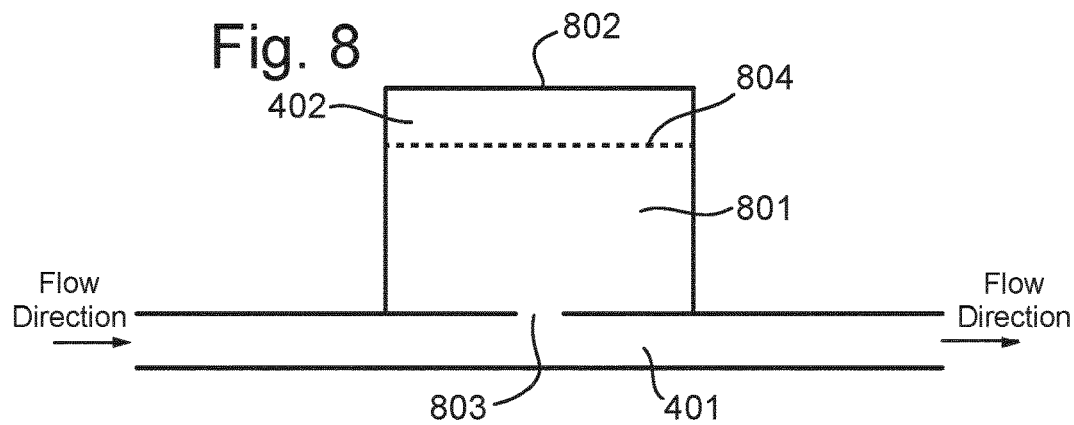

FIG. 8 shows a FIV reduction system according to fourth embodiment.

Figure 9:
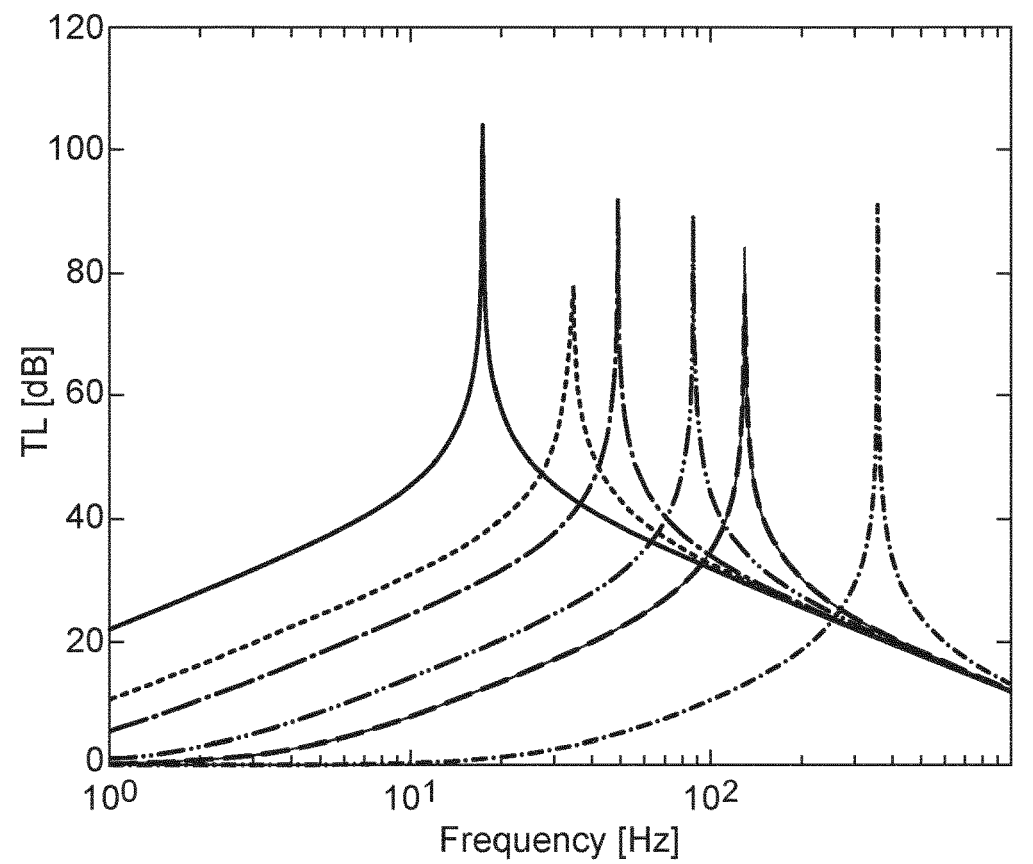

FIG. 9 shows the transmission loss of different implementations of a system according to fourth embodiment.

Figure 10A:
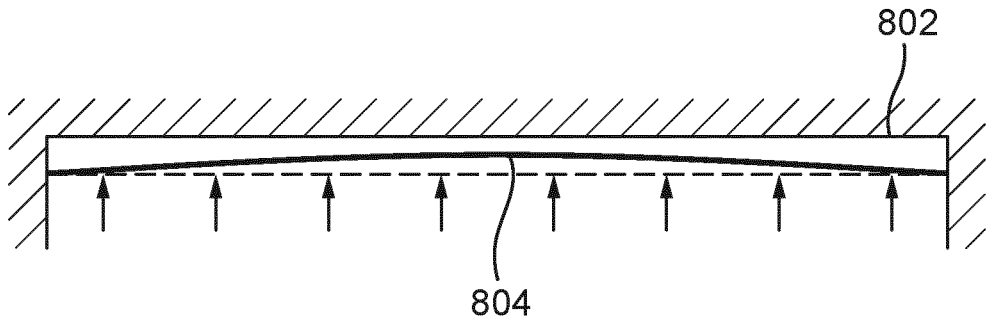
Figure 10B:
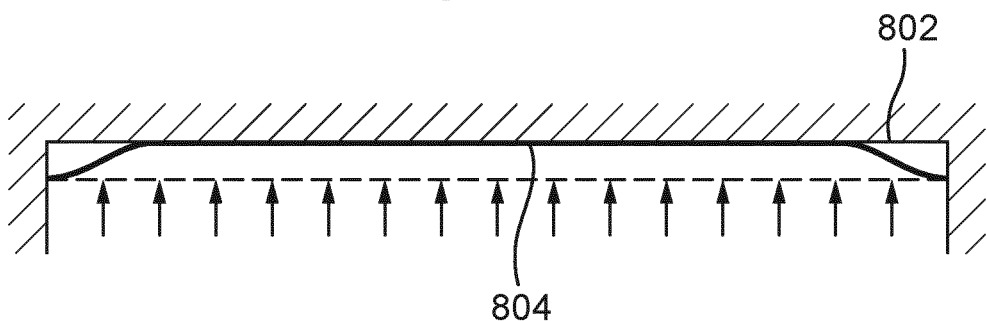
Figure 10C:
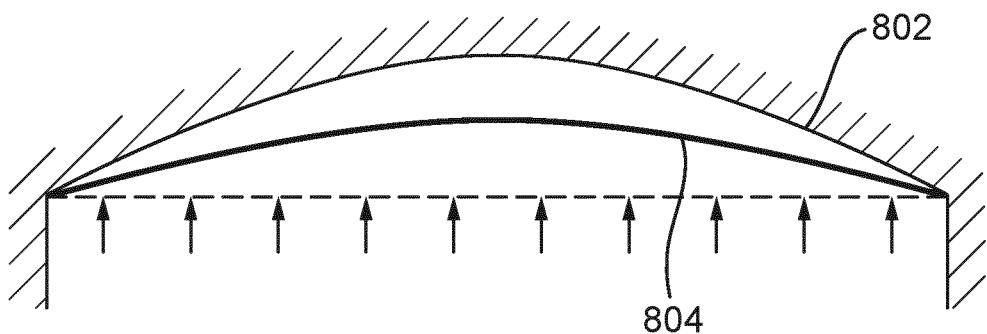

FIG. 10A shows the membrane and the end-stop at normal operating pressures. FIG. 10B shows the operation of the end-stop when the operating pressure is increased above normal limits. FIG. 10C shows an alternative design of end-stop according an embodiment.

Figure 11A:
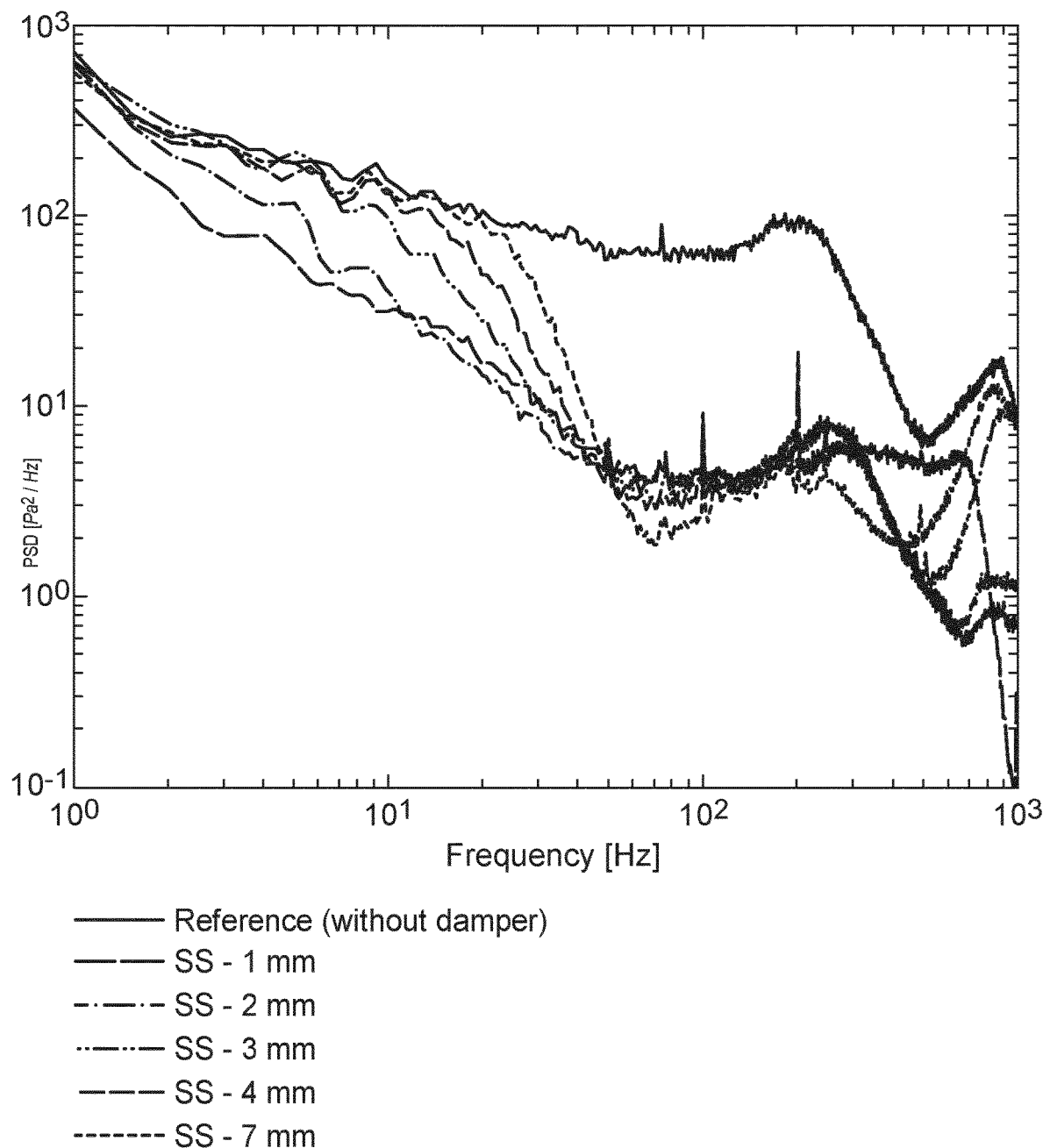
Figure 11B:
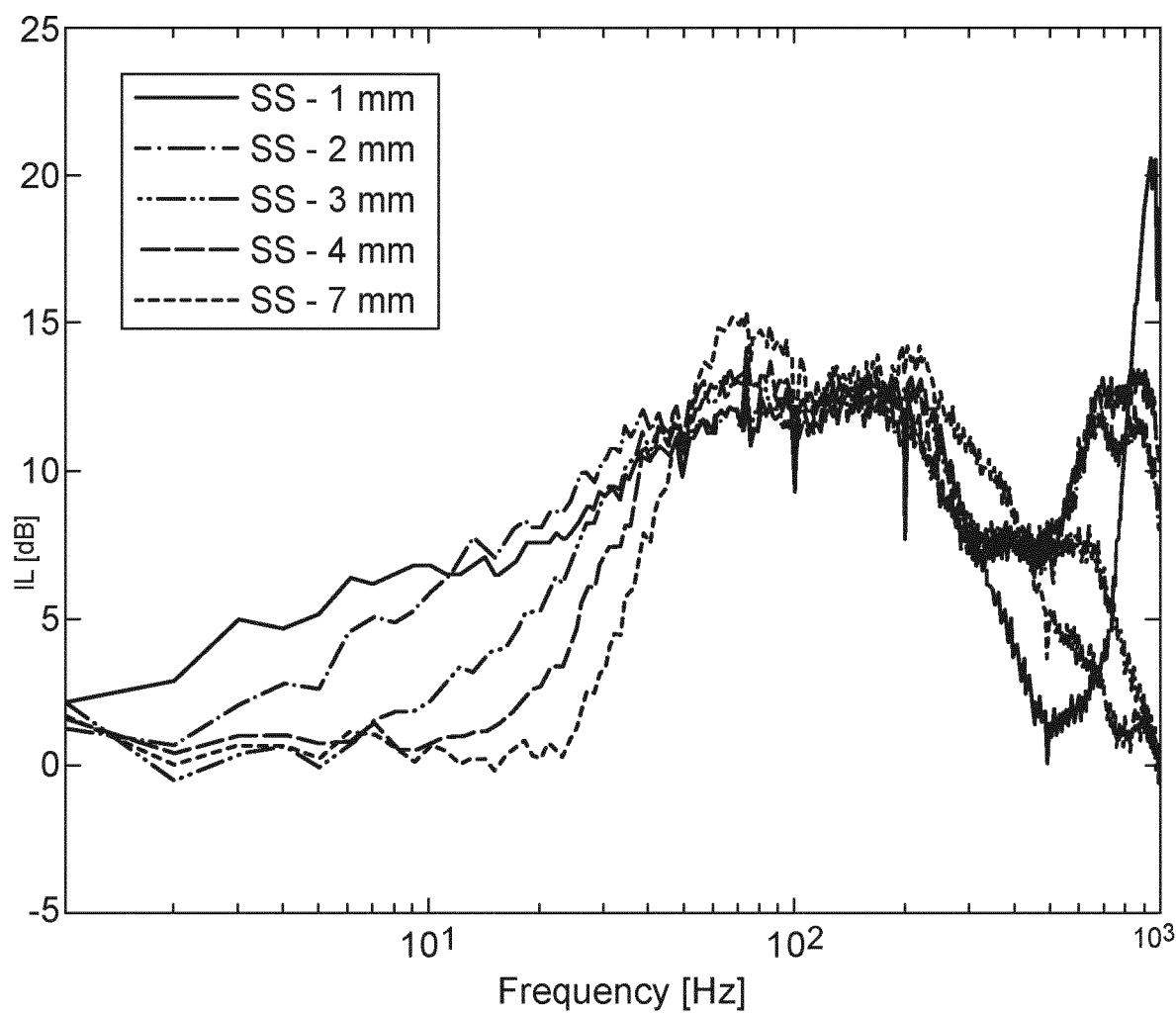

FIGS. 11A and 11B show results that demonstrate the advantages of a system according to fourth embodiment.

Figure 12:
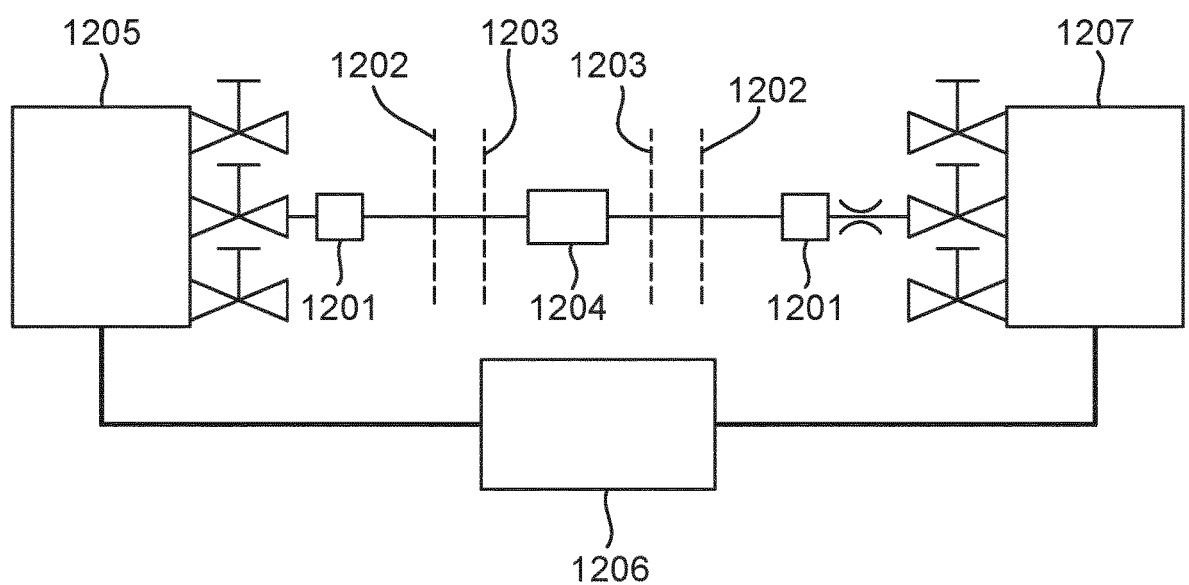

FIG. 12 shows a system according to an embodiment.

FIG. 13 is a flowchart of a method according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
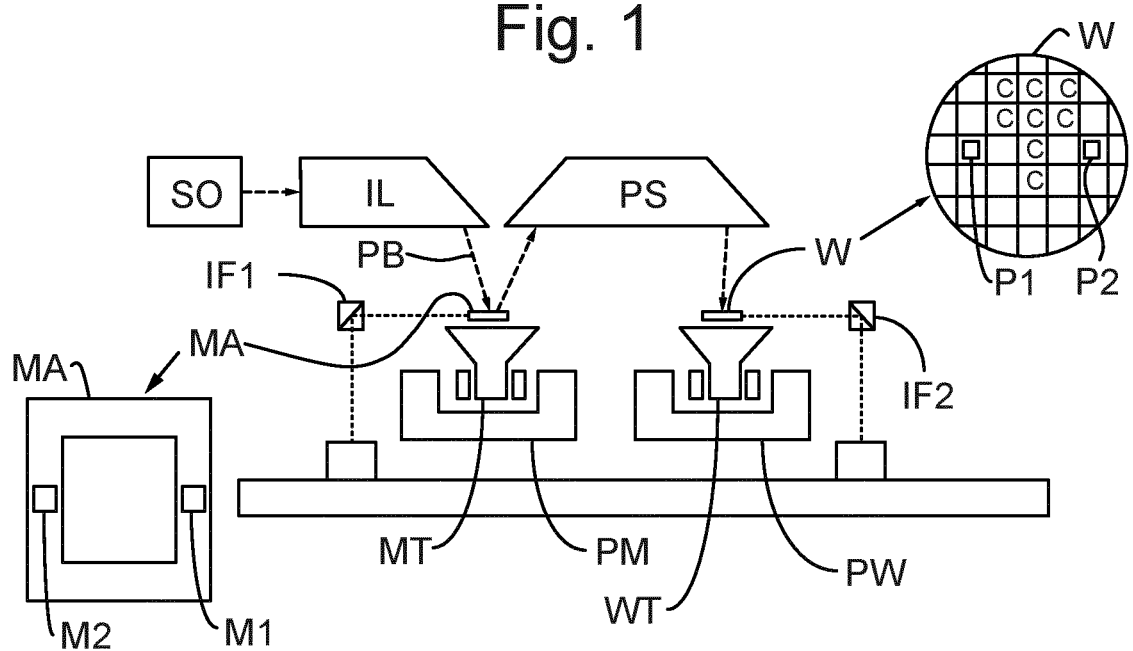

FIG. 1 schematically shows a lithographic apparatus LA including a source collector module SO. The apparatus comprises: an illumination system (illuminator) IL configured to condition a radiation beam B (e.g., EUV radiation); a support structure (e.g., a mask table) MT constructed to support a patterning device (e.g., a mask or a patterning device) MA and connected to a first positioner PM configured to accurately position the patterning device mA; a substrate table (e.g., a wafer table) WT constructed to hold a substrate (e.g., a resist-coated wafer) W and connected to a second positioner PW configured to accurately position the substrate W; and a projection system (e.g., a reflective projection system) PS configured to project a pattern imparted to the radiation beam PB by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT comprises a part for receiving and holding the patterning device MA in a manner that depends on the orientation of the patterning device MA, the design of the lithographic apparatus LA, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device MA may be transmissive or reflective. Examples of patterning devices MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam PB which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum vessel and vacuum pumps.

As here depicted, the apparatus is of a reflective type (i.e., employing a reflective mask and reflective optics in the illuminator IL and projection system PS The lithographic apparatus LA may be of a type having two (dual stage) or more substrate tables (and/or two or more mask tables) WT. In such "multiple stage" machines the additional tables may be used in parallel, or preparatory steps may be carried out on one or more tables while one or more other tables are being used for exposure.

Referring to FIG. 1, the illuminator IL receives an EUV radiation beam from the EUV source SO. Methods to produce EUV radiation include, but are not necessarily limited to, converting a material into a plasma state that has at least one chemical element, e.g., xenon, lithium, or tin, with one or more emission lines in the EUV range. In one such method, often termed laser-produced plasma ("LPP"), the required plasma can be produced by irradiating a fuel, such as a droplet of material having the required line-emitting element, with a laser beam. The EUV source SO may be part of an EUV radiation source including a laser, not shown in FIG. 1, for providing the laser beam exciting the fuel. The resulting plasma emits output radiation, e.g., EUV radiation, which is collected using a radiation collector, disposed in the EUV source.

The laser and the EUV source may be separate entities, for example when a $CO_2$ laser is used to provide the laser beam for fuel excitation. In such cases, the radiation beam PB is passed from the laser to the EUV source with the aid of a beam delivery system comprising, for example, suitable directing mirrors and/or a beam expander. The laser and a fuel supply may be considered to comprise an EUV radiation source.

The illuminator IL may comprise an adjuster for adjusting the angular intensity distribution of the radiation beam PB. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as facetted field and pupil mirror devices. The illuminator IL may be used to condition the radiation beam PB, to have a desired uniformity and intensity distribution in its cross-section.

The radiation beam PB is incident on the patterning device (e.g., mask) MA, which is held on the support structure (e.g., mask table) MT, and is patterned by the patterning device MA. The patterning device MA may be positioned using first positioning device such as interferometer IF1 and mask alignment marks M1, M2. After being reflected from the patterning device (e.g., mask) MA, the patterned radiation beam PB passes through the projection system PS, which focuses the beam PB onto a target portion C of the substrate W. With the aid of the second positioning device such as interferometer IF2 and substrate alignment marks P1, P2 (e.g., using interferometric devices, linear encoders or capacitive sensors), the substrate table WT can be moved accurately, e.g., so as to position different target portions C in the path of the radiation beam PB.

The depicted apparatus could be used in at least one of the following modes:

1. In step mode, the support structure (e.g., mask table) MT and the substrate table WT are kept essentially stationary, while an entire pattern imparted to the radiation beam PB is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam PB is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Figure 2:
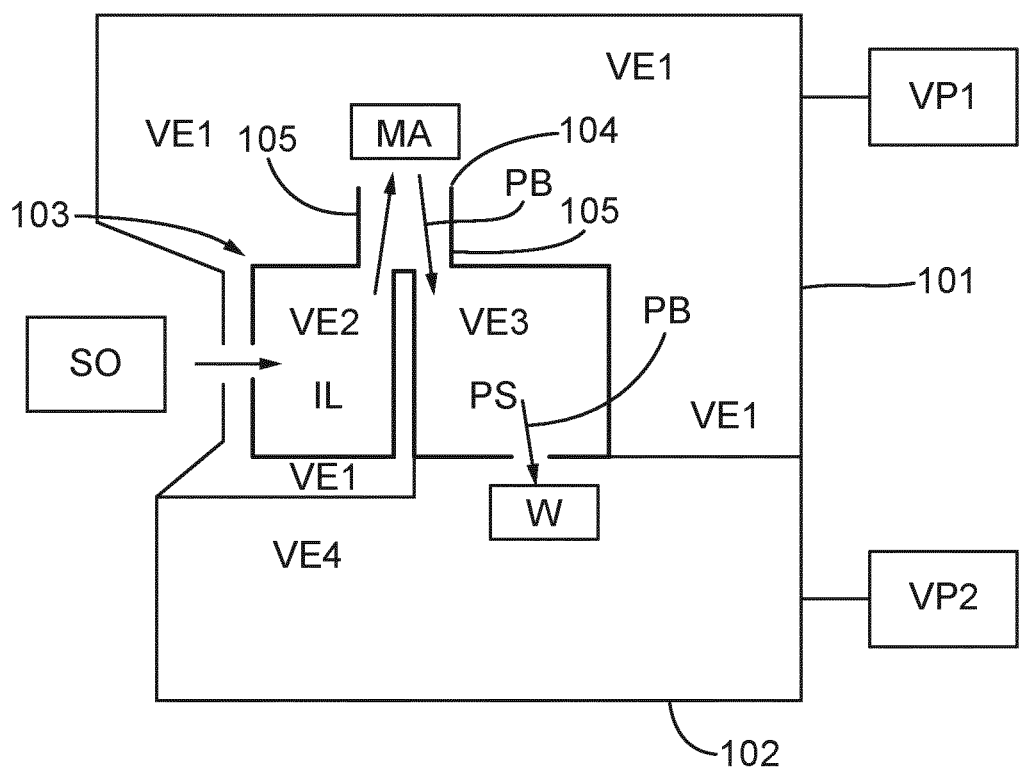
Figure 3:
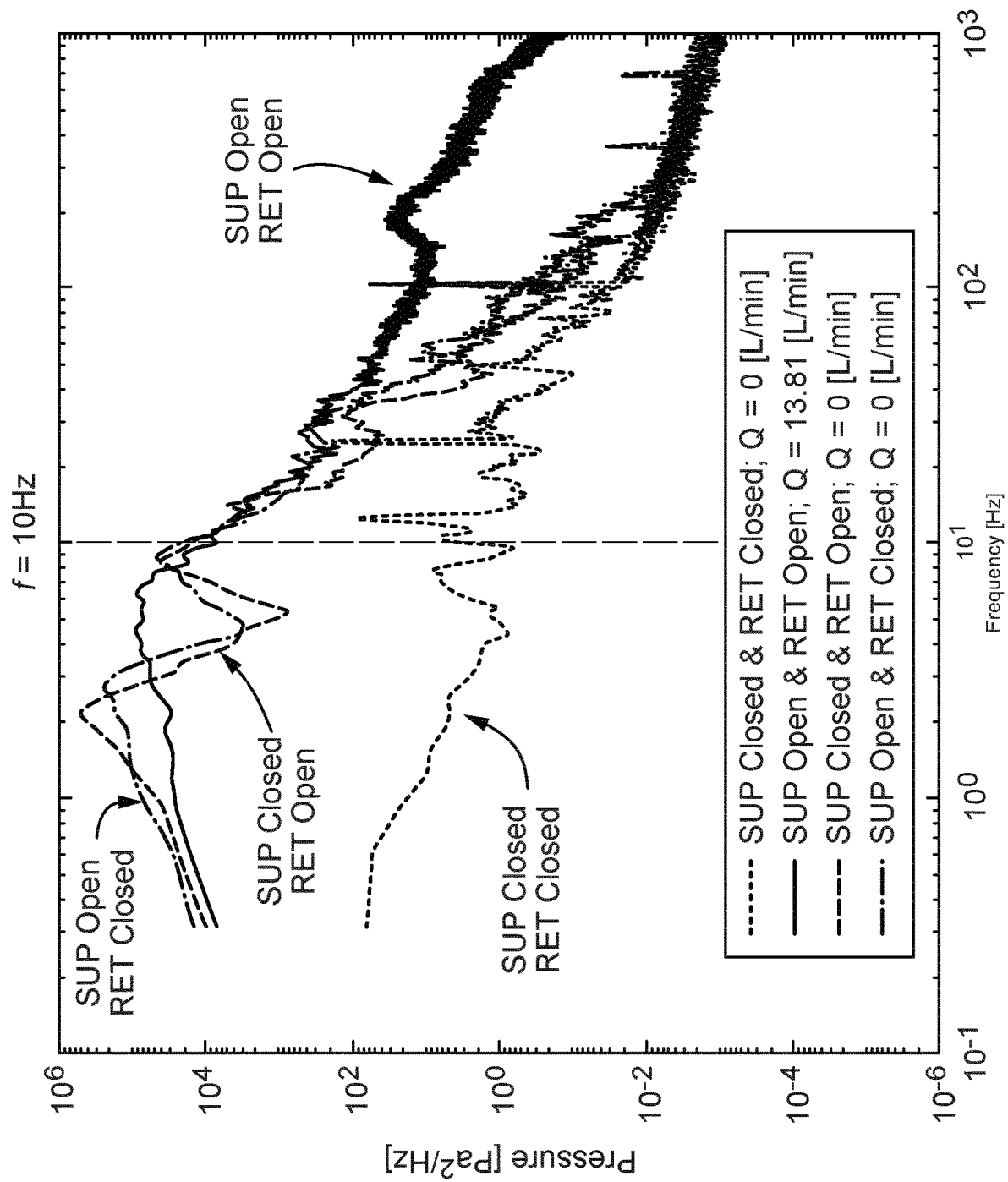
FIG. 3 shows measured pressure variations in a fluid of a temperature conditioning system under different conditions.
Figure 4:
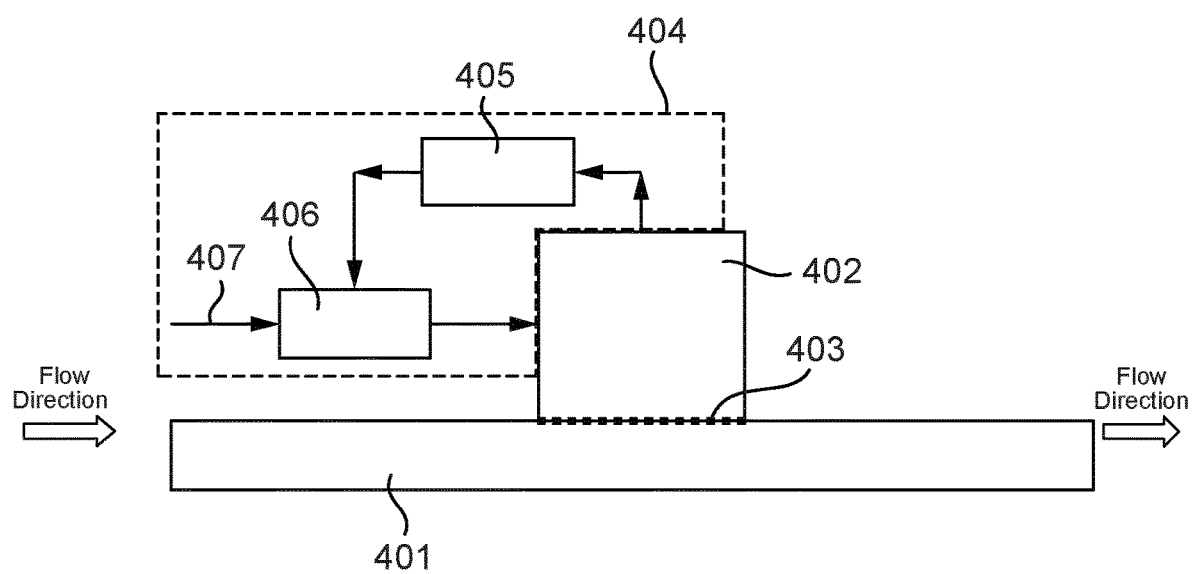
FIG. 4 shows a FIV reduction system according to first, second and third embodiments.

FIG. 2 schematically shows a known apparatus. FIGS. 3 to 5 show parts of this apparatus in more detail. The apparatus of FIG. 2 includes a first chamber 101 that contains an illumination system IL as well as a projection system PS. The illumination system IL is configured to condition a radiation beam received from source SO, and the projection system PS is configured to project a patterned radiation beam PB onto a target portion of a substrate W. First chamber 101 also contains a patterning device support constructed to support the patterning device MA, the patterning device MA being capable of imparting a radiation beam with a pattern in its cross-section to form the patterned radiation beam. A second chamber 102 contains the wafer stage of which for clarity only the substrate W is shown.

FIG. 2 shows how the apparatus may be divided into four different vacuum environments VE1 to VE4. First chamber 101 define a first vacuum environment VE1 that encloses the patterning device stage of which for clarity only the patterning device MA is shown. First chamber 101 also includes a separator construction 103 that defines two further vacuum environments: VE2 housing the illumination system IL, and VE3 housing the projection system PS. Vacuum environments VE2 and VE3 could be further divided. Separator construction 103 includes a sleeve 105 having an aperture 104 for passing the projection beam PB from the illumination system IL to patterning device MA, and for passing the patterned radiation beam from patterning device MA to the projection system PS. The sleeve 105 also serves to force the gas flow downwards (i.e., away from the patterning device) and to maintain the gas flow even to avoid disturbance of the EUV radiation intensity. Possibly the sleeve may taper towards the patterning device MA. Second chamber 102 defines a vacuum environment VE4 that the wafer stage (of which for clarity only substrate W is shown). Vacuum environments VE1 and VE2 are formed and maintained by respective vacuum vessels and vacuum pumps VP1 and VP2, which can also be a plurality of vacuum pumps.

As is shown in FIG. 2 vacuum pump VP1 maintains vacuum environment VE1 at a lower pressure than vacuum environments VE2 and VE3. Clean gas (e.g., hydrogen, helium, nitrogen, oxygen or argon) is injected into vacuum environments VE2 and VE3 using gas injectors (not shown). The vacuum pumps VP1, VP2 as such are known to the skilled person, and may be coupled to the apparatus in various ways.

The separator construction 103 can be arranged in various ways, and may include, for example, a sleeve 105 extending towards the patterning device MA at the end of which sleeve 105 is provided the projection beam aperture 104 extend towards the patterning device MA. The sleeve 105 bearing the aperture 104 may have a tapered cross-section.

In a lithographic apparatus there is a need to provide a temperature conditioning system to ensure that temperature affected components of the system are maintained at an appropriate temperature. Temperature variations can introduce errors into the performance of a system due to effects such as the size of components changing. Temperature conditioning is particularly important for an EUV lithographic apparatus. The high accuracy required by an EUV lithographic apparatus results in some of its components having particularly strict tolerances on the allowable temperature variations.

A temperature conditioning system typically comprises heat exchangers, that may be channels or plates, and the heat exchangers directly cool, or heat, a component by conduction. The heat exchangers may themselves be temperature controlled by a fluid that flows through the heat exchanger. It is known for each heat exchanger to have at least one conduit that supplies fluid to the heat exchanger and at least one conduit that provides a return path of fluid from the heat exchanger. The temperature conditioning system comprises one or more pumps that force fluid through the heat exchangers. The fluid supply to the heat exchangers maintains the temperature of each heat exchanger at an appropriate temperature for maintaining a temperature controlled component of the system at its required temperature. The fluid supplied to each heat exchanger is typically a liquid, such as water.

A problem experienced when using a temperature conditioning system to control the temperature of a component of a lithographic apparatus is that the flow of fluid may cause the component to vibrate and the vibrations may degrade the performance of the component.

A potential cause of vibration is flow induced vibration, referred to as FIV. FIVs are vibrations that are introduced due to dynamic forces that are caused by pressure fluctuations in the fluid flow. Turbulent separated flow generates high levels of pressure fluctuations, of which particularly the acoustic pressure fluctuations can propagate through the fluid medium far into the system. A potential cause of FIV is related to the design of the fluid flow paths through the entire temperature conditioning system up to the vibration sensitive components that need to be cooled. Other potential causes of FIV at a component may be caused by one or more of the cabinet (that includes the pump), the base frame manifolds and other flow paths that are delivering a flow fluid to other components and are connected in parallel via the same manifold.

Generally speaking, the design of fluid paths through the part of a temperature conditioning system in the vacuum part of an EUV lithographic apparatus has been substantially optimized, such as by providing low radius turns and avoiding substantial flow path cross-section changes, to the extent that design of the fluid flow path is not usually a substantial cause of FIVs. However, the other causes of FIV may result in the FIVs at a component being outside of a performance specification.

A component of an EUV lithographic apparatus for which temperature conditioning is particularly important is the sensor frame of a projection optics box, referred to herein as a POB. It is therefore preferable for a temperature conditioning system to control the temperature of the sensor frame of the POB by a fluid flowing through heat exchangers as described above. However, for an EUV lithographic apparatus, the allowable tolerances of the vibration levels for the sensor frame of the POB are very low. The vibration budget may be many times less than that of corresponding components in other types of lithographic apparatus.

FIV comprises low frequency vibration components and high frequency vibration components. The low frequency vibration components may be defined as having a frequency of 30 Hz or less. The high frequency components may have a frequency of greater than 30 Hz. The high frequency components may be substantially attenuated by the use of, for example, flexible conduits (of a suitable length for providing an appropriate attenuation to the high frequencies) and are therefore not usually a cause of problematic vibrations. However, the low frequency vibration components may propagate throughout the fluid without being substantially attenuated and may therefore be a cause of problematic vibrations. The low frequency vibrations may be experienced at a component even when the component is located a long way from the source of the vibrations and when a substantial length of flexible conduit is used.

FIG. 3 shows measured pressure variations in a fluid of a temperature conditioning system under different conditions. The temperature conditioning system has a valve in the supply path, referred to as SUP, and a valve in the return path, referred to as RET. The fluid in the temperature conditioning system is water. When both the SUP and RET valves are open, fluid flows through the conduits and heat exchangers of the system and pressure variations can be caused by both FIV and the flow of fluid through the flow path. When only one of the SUP and RET valves is open and the other valve is closed, there is no flow of fluid through the flow path. The measured pressure variations may therefore be caused by FIV but not by the flow of fluid through the flow path. When both the SUP and RET valves are closed, there is no flow of fluid through the system and the system is substantially decoupled from the cause of FIV.

FIG. 3 shows measured pressure variations in the fluid of the temperature conditioning system under the four different conditions of: both the SUP and RET valves being open, the SUP valve being open and the RET valve being closed, the SUP valve being closed and the RET valve being open, and both the SUP valve being closed and the RET valve being closed.

The results in FIG. 3 show that there are significant vibrations caused by the use of the temperature conditioning system because the pressure level is clearly lowest when both valves are closed.

The results indicate that the amount of FIV vibration does not significantly change when only one of the valves is closed and the effect of the flow of fluid through the flow paths is removed. The magnitude of the power of the FIV vibration is therefore substantially independent of the amount of fluid flowing through the system.

The results also indicate that the magnitude of the power of the FIV vibration is largest at the low frequencies. The magnitude of the power of the FIV vibration starts to reduce significantly at frequencies above about 10 Hz.

The magnitude of the power of the low frequency FIV caused by a thermal conditioning system, as shown in FIG. 3, may produce vibrations that substantially exceed the maximum allowed specification of one or more of the temperature controlled components. This is a particular problem for known implementations of a number of vibration sensitive components, such as the sensor frame of a POB and the wafer (i.e. substrate) stage metro frame (WSMF) of an EUV lithographic apparatus.

Embodiments solve the above problem by providing a system that reduces the magnitude of FIV, in particular the low frequency FIV, in a thermal conditioning system.

FIG. 4 shows a system, that may be referred to as a FIV reduction system, according to first, second and third embodiments. FIG. 4 shows a conduit 401 of a thermal conditioning system. A fluid, that is a liquid, is travelling through the conduit 401. The conduit 401 may be on either the supply path of the liquid to a temperature controlled component or the return path of the liquid from the temperature controlled component.

The system may comprise a gas chamber 402 that comprises a gas. The gas chamber 402 may have a gas supply and gas return path. A gas pressure control system 404 may be provided that automatically controls the gas flows through the gas supply and gas return paths so as to automatically control the gas pressure in the gas chamber 402. The gas pressure control system 404 may comprise a gas pressure controller 405 and a gas pressure regulator 406. The gas pressure control system 404 may be controlled be a control signal 407.

In first, second and third embodiments, the liquid in the conduit 401 may be water or any other suitable liquid for use in a temperature conditioning system. The gas in the gas chamber 402 may be any suitable gas, such as air, substantially pure nitrogen or carbon tetrafluoride.

An interface region 403 is provided in at least part of the wall of the conduit 401. The interface region 403 provides an interface between the gas chamber 402 and the liquid in the conduit 401. A membrane may be provided across the interface region 403 that physically separates the gas in the gas chamber 402 from the liquid in the conduit 401, according to second and third embodiments. However, the gas in the gas chamber 402 may alternatively be in direct contact with the liquid in the conduit 401, according to first embodiment.

The interface between the gas chamber 402 and the liquid in the conduit 401 may be a T-junction. Alternatively, in particular when a membrane is provided across the interface region 403, the gas chamber 402 may be circumferentially surrounding the conduit 401.

The interface region 403 provides a compliant region in the wall of the conduit 401. The compliance of the interface region 403 is dependent on the pressure of the gas in the gas chamber 402 and, if a membrane is present, the flexibility of the membrane. The compliance of the interface region 403 is controllable by controlling the pressure of the gas in the gas chamber 402.

The provision of the interface region 403 in the system according to first, second and third embodiments reduces the FIV in the fluid. The compliance of the interface region 403 reduces the FIV in the fluid by absorbing and/or reflecting the FIV.

The gas in the gas chamber 402 is substantially more compressible than the liquid in the conduit 401. The reduction of the FIV by the gas is dependent on the hydraulic stiffness of the gas.

When V is the gas volume and $P_o$ is the absolute pressure of the gas, the hydraulic stiffness of a gas volume can be expressed as:

$$C_{HS\_GAS} = \frac{\gamma P_o}{V}$$

where for an isothermal process $\gamma=1$, and, for an adiabatic process, $\gamma=\kappa$ with $\kappa$ being the adiabatic index.

The hydraulic stiffness of the gas volume can therefore be reduced by increasing the gas volume.

Embodiments include both the use of a membrane in the interface region 403 between the gas in the gas chamber 402 and the liquid in the conduit 401 (second and third embodiments) and also there being no membrane so that there is direct contact at the interface region 403 between the gas and the liquid (first embodiment).

When a membrane is present, the stiffness of the membrane limits the overall reduction of hydraulic stiffness that can be achieved. Embodiments therefore preferably use a membrane that is very flexible. The flexibility of the membrane may be increased by increasing the size of the membrane and/or by reducing the thickness of the membrane. The size of the membrane may be increased by increasing the size of the interface region 403, for example by increasing the extent that it extends along the length of the conduit 401 and/or extends around the circumference of the conduit 401.

Transmission loss (TL) can be defined as the ratio between the sound power incident to a muffler ($W_i$) and the transmitted sound power ($W_t$). The transmission loss can be determined as:

$$TL = 10\log_{10}\left(\frac{W_i}{W_t}\right)$$

Figure 5A:
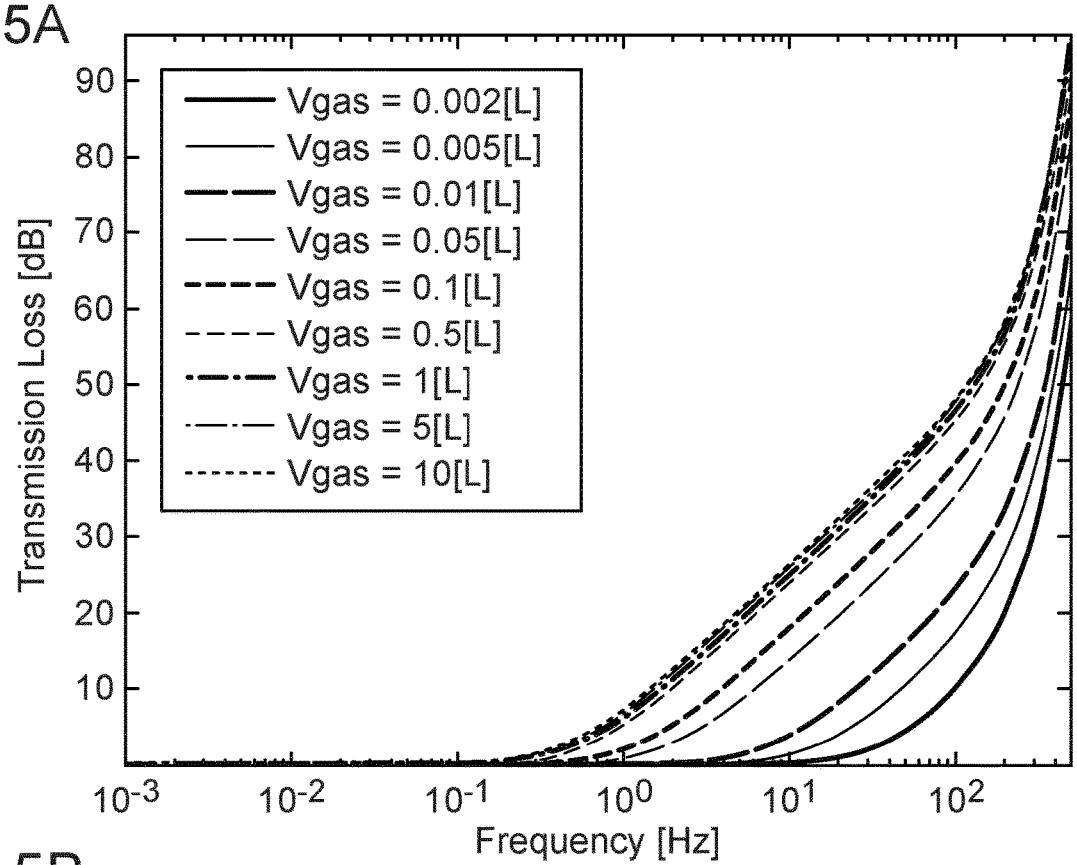
FIGS. 5A and 5B show the transmission loss of different implementations of a system according to first, second, and third embodiments.
Figure 5B:
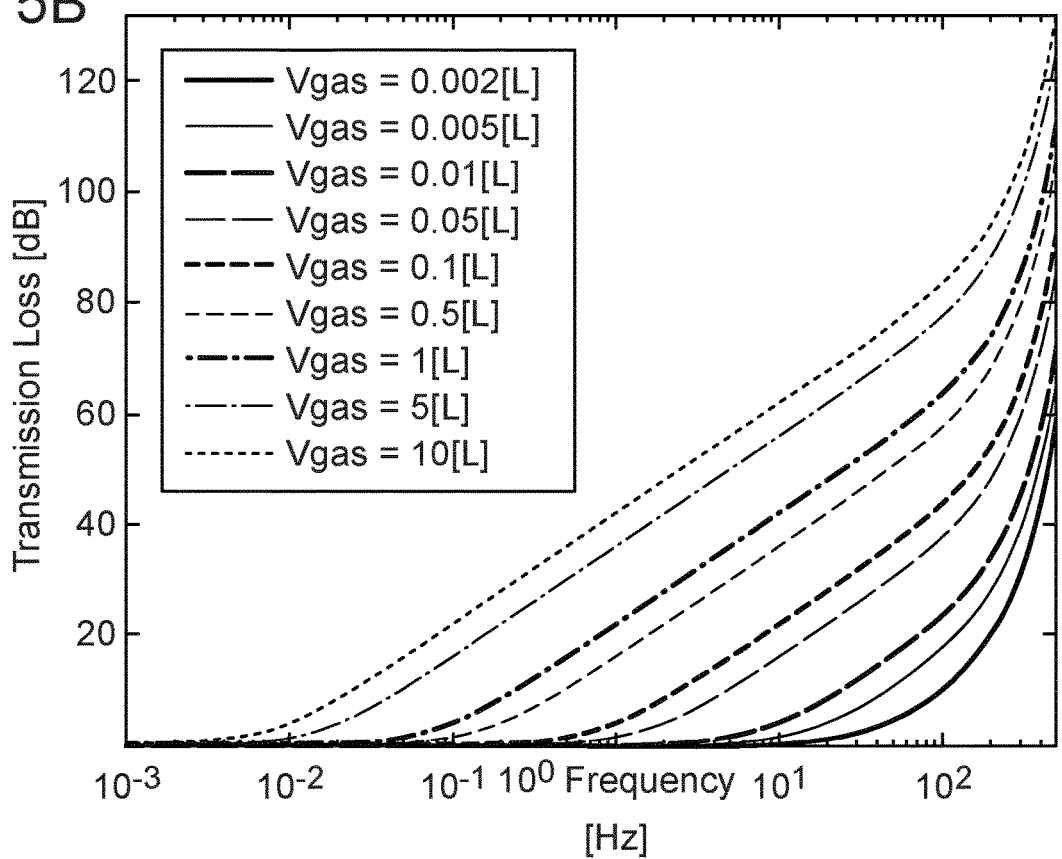

FIGS. 5A and 5B show how the transmission loss of an implementation of a system according to first, second and third embodiments is dependent on both the volume of gas in the gas chamber 402 and the presence of a membrane. A large transmission loss indicates that pressure fluctuations in the liquid are suppressed and that the FIV in the liquid are therefore reduced.

FIG. 5A shows the transmission loss as a function of frequency when a membrane is provided between the gas chamber 402 and the liquid in the conduit 401. The measurements were performed for gas volumes of 0.002 L, 0.005 L, 0.01 L, 0.05 L, 0.1 L, 0.5 L, 1 L, 5 l and 10 L.

FIG. 5B shows the transmission loss as a function of frequency when there is no membrane between the gas chamber 402 and the liquid in the conduit 401. The measurements were performed for gas volumes of 0.002 L, 0.005 L, 0.01 L, 0.05 L, 0.1 L, 0.5 L, 1 L, 5 L and 10 L.

In both FIGS. 5A and 5B, the liquid was water and the gas was air. The absolute pressure of the gas was $P_o=4.5$ bara. The stiffness of the membrane used in FIG. 5A at 1 Hz was 2.8E9 Pa/m$^3$.

FIG. 5A shows that when a membrane is used, increasing the gas volume above about 0.5 L does provide a substantial gain in low frequency performance. This is because the stiffness of the membrane is restricting the reduction in hydraulic stiffness that can be achieved.

FIG. 5B shows that when no membrane is used and so the gas is in direct contact with the liquid, increasing the gas volume increases the performance. In particular, for all of the tested gas volumes, the low frequency performance always increases as the gas volume is increased.

FIGS. 6A, 6B and 6C are further results that demonstrate the advantages of the system according to embodiments. The measurements have been obtained from a laboratory test set-up. There is no membrane. The gas is air and the liquid is water. The gas pressure is approximately 5 Bara. The total flow rate of liquid through the pumps of the thermal conditioning system was about 125 L/min. Only some of this total fluid flow was passed through the component in which the vibrations were measured and the fluid flow through the component was about 7.71 L/min.

In a first arrangement of a valve system, indicated in FIGS. 6A, 6B and 6C as PPL open, there is direct contact between the gas and the liquid. In a second arrangement of the valve system, indicated in FIGS. 6A, 6B and 6C as PPL closed, the gas is decoupled from the liquid. A comparison of the first and second arrangements of a valve system is therefore a comparison of an implementation of a system according to the first embodiment (when there is no membrane present) and known techniques that do not comprise a FIV reduction system according to embodiments.

In FIG. 6A, the volume of the gas chamber 402 was 2 mL, in FIG. 6B, the volume of the gas chamber 402 was 100 mL and in FIG. 6C, the volume of the gas chamber 402 was 1000 mL.

FIGS. 6A, 6B, and 6C clearly demonstrate that by the system according to first, second and third embodiments can substantially reduce the magnitude of the FIV, in particular the low frequency FIV.

FIG. 7 shows measured results when the system according to first embodiment was used on an actual sensor frame of a POB of an EUV apparatus. There was no membrane and the volume of the gas chamber 402 was 1000 mL. The arrangement shown in FIG. 7 also has a valve system. In a first arrangement of the valve system, indicated as PPL open, there is direct contact between the gas and the liquid. In a second arrangement of the valve system, indicated as PPL closed, the gas is decoupled from the liquid. SFr inlet is a sensor at the inlet of the sensor frame, SFr mid is a sensor in the sensor frame, and SFr outlet is a sensor at the outlet of the sensor frame. The flow rate through the pumps of the thermal conditioning system was about 123 L/min and the flow rate through the sensor frame was about 7.54 L/min.

The results shown in FIG. 7 demonstrate that the magnitude of low frequency FIV can be reduced by up to 2-3 orders of magnitude in power by the system according to first, second and third embodiments.

Although the FIV suppression is improved when a membrane is not used, the use of a membrane prevents potential problems that may occur when there is direct contact between the gas in the gas chamber 402 and the liquid in the conduit 401. Such potential problems may include:

The absorption of gas in the liquid reducing the pressure in the gas volume;

The liquid becoming saturated with gas and bubbles occurring when the liquid is super saturated. The bubbles may create air pockets within the pipe system for the liquid; and When the system is turned on or shut down it may be difficult to prevent gas entering the pipe system of the liquid.

An implementation of the system without a membrane may still be preferred because the above potential problems may be solved, or not occur. For example, by using nitrogen gas instead of air, the amount of gas that may dissolve in the liquid may be reduced.

The system according to third embodiment may include a gas pressure control system 404. The gas pressure control system 404 may comprise a gas pressure controller 405, a gas pressure regulator 406, sensors and other components for automatically controlling gas pressure in the gas chamber 402. The gas pressure control system 404 may control the gas pressure in dependence on a control signal 407.

The use of a gas pressure control system 404 provides an alternative, or additional, way of increasing the suppression of low frequency FIV to increasing the volume of the gas chamber 402.

The compliance of the gas in the gas chamber 402 is dependent on the gas pressure. The gas pressure control system 404 may be arranged to control the gas pressure in dependence of the pressure of the liquid flowing through the conduit 401 of the system. The gas pressure control system 404 may be arranged to have a response that is relatively slow to pressure changes in the liquid so that the gas pressure is primarily controlled to reduce low frequency FIVs in the liquid. The high frequency FIVs would be suppressed by the gas volume and/or the use of flexible conduits in the flow path of the fluid. Effective suppression of both low and high frequency FIVs is therefore achieved.

The gas pressure control system 404 may be arranged to maintain the average gas pressure in the gas chamber 402 to be substantially constant. The gas pressure control system 404 would therefore compensate for any loss of gas, such as due to gas being dissolved in the liquid.

The use of a gas pressure control system 404 also allows good suppression of low frequency FIV to be achieved when a relatively stiff membrane is used.

An active system as described for the third embodiment, including the gas pressure control system, increases the complexity and cost of the system compared to a passive system. A passive system may be smaller than an active system as well as easier to install and operate.

According to a fourth embodiment of a FIV reduction system, the FIV reduction system is a passive system and a liquid filled cavity 801, that comprises liquid from the conduit, may be provided between the conduit 401 and the gas chamber 402.

The FIV reduction system according to fourth embodiment is shown in FIG. 8. FIG. 8 shows a conduit 401 and a fluid, that is a liquid, flows through the conduit 401. The conduit 401 may be on either the supply path of the liquid to a temperature controlled component or the return path of the liquid from the temperature controlled component.

The liquid in the liquid filled cavity 801 is the same as the liquid in the conduit 401. One or more openings 803 are provided in the wall of the conduit 401 between the liquid filled cavity 801 and the conduit 401. Each opening 803 may be, for example, a neck. The one or more openings 803 extend along at least part of the wall of the conduit 401. The one or more openings 803 may be, for example, in the shape of slots, that are either parallel to or perpendicular to the longitudinal axis of the conduit 401, or circular holes. The one or more openings 803 may be arranged as a row of several small openings rather than a single larger opening.

The one or more openings 803 may have a combined cross-sectional area substantially smaller than the cross-sectional area of the membrane 804 in contact with liquid in the liquid filled cavity 801. The ratio of the combined cross-sectional area of the openings 803 to the cross-sectional area of the membrane 804 may be, for example, between 1:4 to 1:1000. Increasing the ratio may increase the and effectiveness of FIV reduction by the FIV reduction system.

Each of the one or more openings 803 may be a short tube that connects the liquid filled cavity 801 to the conduit 401, or a hole in the wall of the conduit 401 directly leading into the liquid filled cavity 801.

Each of the one or more openings 803 may be configured in a way that limits the introduction of new vibrations in the fluid in the conduit 401 due to the stagnation of the fluid on the downstream edge of the opening 803 (i.e., the edge of the opening 803 facing opposite to the predominant direction of the fluid's velocity) and/or the stagnation of the fluid on the downstream side of the liquid filled cavity 801 (i.e., the internal side of the liquid filled cavity 801 facing opposite to the predominant direction of the fluid's velocity). This can be done by limiting the size of the opening and as such a narrow opening may be preferred to obtain a smoother conduit 401 overall.

The intersection between the liquid filled cavity 801 and the conduit 401 may be a T-junction. Alternatively, the liquid filled cavity 801 may circumferentially surround the conduit 401.

A membrane 804, that may be substantially the same as the membrane in second and third embodiments, is provided between the liquid filled cavity 801 and a gas. The gas may be at substantially the ambient pressure of the region of the lithographic apparatus. The membrane 804 separates the liquid in the liquid filled cavity 801 from the gas.

The membrane 804 provides a compliant region which reduces FIVs in the liquid in the conduit 401 by absorbing and/or reflecting the FIV. The compliance of the compliant region is substantially only dependent on the stiffness of the membrane 804, rather than the pressure of the gas, because the gas is at ambient pressure.

The stiffness of the membrane may be configured to reduce low frequency FIVs in the liquid in the conduit 401.

The membrane 804 may be a thin plate, with thin herein referring to any thickness such that the stiffness of the membrane 804 is sufficiently low to damp low frequency FIVs in the liquid in the conduit 401. For example, a thin membrane may have a thickness in the range 0.1 mm to 10 mm.

The membrane 804 may be made of any suitable material, such as a metal, for example stainless steel or aluminium. The membrane may alternatively be a polymer.

At low frequencies and assuming a circular membrane with a clamped edge and a uniform pressure load, the stiffness of the membrane 804 can be approximated to be:

$$C_M = \frac{192 D_r}{\pi r^6}$$

where r is the radius of the membrane 804 and $D_r$ is the flexural rigidity of the membrane 804 defined as:

$$D_r = \frac{Et^3}{12(1-v^2)}$$

where E is the Young's Modulus of the membrane 804, t is the thickness of the membrane 804 and v is the Poisson's ratio of the membrane 804.

The stiffness of the membrane 804 limits the overall hydraulic compliance that can be achieved. Embodiments therefore preferably use a membrane 804 with low stiffness. The stiffness of the membrane 804 can be reduced by increasing the size of the membrane 804, by reducing the thickness of the membrane 804 and/or by choice of material of the membrane 804. The size of the membrane 804 may be increased by increasing the size of at least the part of the liquid filled cavity 801 that contacts the membrane 804. For example, the extent to which the liquid filled cavity 801 extends along the length of the conduit 401, and/or extends around the circumference of the conduit 401, may be increased.

In the fourth embodiment, the liquid in the conduit 401 and the liquid in the liquid filled cavity 801 may be water or any other suitable liquid for use in a temperature conditioning system. The gas may be any suitable gas, such as air, substantially pure nitrogen or carbon tetrafluoride.

The system according to the fourth embodiment may comprise a gas chamber 402 that encloses the gas which is in contact with the membrane 804. The gas chamber 402 is located on the gas side of the membrane 804 and may have a cross-sectional area substantially equal to that of the liquid filled cavity 801 and the membrane 804. The sides of the gas chamber 402 are substantially aligned with the sides of the liquid filled cavity 801. The gas in the gas chamber 402 may be at substantially the ambient pressure of the region of the lithographic apparatus.

The volume of gas in the gas chamber 402 may be sufficiently large such that the hydraulic stiffness of the gas volume is not dominant over the stiffness of the membrane 804. Embodiments also include there being no gas chamber 402 is provided. In this embodiment, the gas is not contained and the effective gas volume can be considered to be substantially infinite.

The total hydraulic stiffness of the system according to fourth embodiment is given by:

$$\frac{1}{C_{HS}} = \frac{1}{C_M} + \frac{1}{C_{HS\_LIQUID}}$$

where $C_{HS\_LIQUID}$ is the hydraulic stiffness of the liquid in the liquid filled cavity 801 approximated by:

$$C_{HS\_LIQUID} = \frac{B_{LIQUID}}{V_{LIQUID}}$$

where $B_{LIQUID}$ is the bulk modulus of the liquid in the liquid filled cavity 801 and $V_{LIQUID}$ is the volume of the liquid filled cavity 801.

It will be appreciated by the skilled person that a bellow may provide sufficient compliancy such that it can be used across the interface region 403 that physically separates the gas in the gas chamber 402 from the liquid in the conduit 401. The bellow may comprise metal.

FIG. 9 shows how the transmission loss of an implementation of a FIV reduction system according to fourth embodiment is dependent on the thickness of the membrane 804. A large transmission loss indicates that pressure fluctuations in the liquid are suppressed and that the FIV in the liquid are therefore reduced.

FIG. 9 shows the calculated transmission loss as a function of frequency for various membrane configurations. The calculations were performed for membrane thicknesses of 1 mm, 2 mm, 3 mm and 4 mm for a membrane 804 made out of stainless steel (denoted SS in FIG. 9), and for a thickness of 6.5 mm for a membrane 804 made out of aluminium (denoted ALU in FIG. 9). Included is also a calculation of the transmission loss using a two membranes 804, each made out of stainless steel and with a thickness of 2 mm (denoted 2×2 mm SS in FIG. 9). The two membranes, that are both membranes for the same liquid filled cavity 801, were placed side by side with a rigid component attaching them to each other. All membranes 804 had the same area. The liquid was water and the gas was air.

In FIG. 9 it can be seen that the lower the thickness of the membrane 804, the lower the frequency for which there is a peak in transmission loss. It can also be seen that the resonant frequency for a system using two membranes is lower than that of a system using only one membrane 804 of the same thickness.

It is therefore preferred to have a thin membrane 804. However, there is a limit to how thin the membrane 804 can be since a thin membrane 804 may only be able to sustain low operating pressures. For higher operating pressures there may be plastic deformation of the membrane 804 and/or the membrane 804 may fracture.

It can also be seen that the aluminum membrane with a thickness of 6.5 mm had the same resonance frequency as the stainless steel membrane with a thickness of 4 mm. Accordingly, it may be preferable to use aluminum rather than steel as the same vibrational performance can be achieved using a thicker membrane.

Dependent on the membrane thickness, there is a limit to the maximum operating pressure. To mitigate this issue, an end-stop 802 may be used. The end-stop 802 limits the possible deformation of the membrane 804 such that when the operating pressure is sufficiently high, the end-stop 802 will prevent further deflection of the membrane 804 and thus prevent plastic deformation or other damage. During normal operating pressures, the end-stop 802 may not be in contact with the membrane 804 and contact may only happen when the operating pressure is increased above normal limits. The end-stop 802 can be seen in FIG. 10A during normal operating pressures when there is no contact between the end-stop 802 and the membrane 804. The operation of the end-stop 802 when the operating pressure is increased above normal limits can be seen in FIG. 10B.

In an embodiment comprising a gas chamber 402, a side of the gas chamber 402, that is an end of the gas chamber 402, is substantially parallel to the plane of the membrane 804 and may provide the end-stop 802. Such an arrangement may limit the size of the gas chamber 402 since the side of the gas chamber 402, that comprises the end-stop, has to be sufficiently close to the membrane 804 to function as an end-stop 802. To prevent the gas in the gas chamber 402 being pressurized, the end-stop may have one or more through holes that gas can flow through. The end-stop may alternatively have no through holes.

Alternatively, the end-stop 802 may be placed inside the gas chamber 402. The end-stop 802 may then be attached to either of the sides of the gas chamber 402 for structural support. There may additionally be one or more through holes in the end-stop 802 such that it does not divide the gas chamber 402 into two separate compartments. This allows the volume of the gas chamber 402 to be substantial and hence the hydraulic stiffness of the gas volume to be sufficiently low. There may alternatively be no through holes in the end-stop 802.

The end-stop 802 may be of several different designs, so long as it performs its function of preventing plastic deformation of the membrane 804 at higher than normal operating pressures. One possible design of the end-stop 802 is a flat plate design as shown in FIG. 10A. In such a design, the center of the membrane 804, which will be deflected the most, will touch the end-stop 802 before the surrounding areas of the membrane 804. As such, the design does prevent plastic deformation at the center of the membrane 804, which is where the stress is, initially, the highest.

The end-stop 802 may alternatively be of a curved 3D design, as shown in FIG. 10C, such that, when the membrane 804 is deformed elastically the entire membrane 804 is in contact with the end-stop 802. The end-stop 802 profile thus matches the deformation profile of the membrane 804. Thus the FIV reduction system according to fourth embodiment with a 3D end-stop may be designed to withstand substantially higher than normal operating pressures without fracture of the membrane 804, since deflection of all parts of the membrane 804 to the point of damage is prevented by the end-stop 802. However, normal operating pressures may still not be arbitrarily large, since a large enough operating pressure which imposes contact between the membrane 804 and the 3D end-stop may limit the performance of the FIV reduction system.

The end-stop 802 may have one or more holes through its surface such that the gas volume may be considered effectively unlimited. Such holes should be small enough that they do not inhibit the elementary function of the end-stop 802 to prevent plastic deformation of the membrane 804.

FIG. 11 shows the performance of the FIV reduction system according to fourth embodiment in a test rig. The closed loop circuit test rig comprised a pump situated upstream of the FIV reduction system, an orifice located downstream of the FIV reduction system which generated acoustic noise and a pressure probe located upstream of the FIV reduction system to measure the pressure fluctuations at this point. The acoustic noise from the orifice, through pressure fluctuations, travelled upstream to, and through, the FIV reduction system after which the pressure fluctuations were measured by the pressure probe. The measurements were made at normal operating pressures (i.e. without the membrane 804 being in contact with the end-stop). The liquid used in the conduit and the liquid filled cavity 801 was water and the gas in the gas chamber 402 was air.

FIG. 11A shows the effect of decreasing the membrane thickness on the power spectral density as a function of frequency. Measurements were made using membranes 804 made out of stainless steel using membrane thicknesses of 1 mm, 2 mm, 3 mm, 4 mm, and 7 mm.

The tests show a decrease in power spectral density for frequencies below 500 Hz when the FIV reduction system according to fourth embodiment is used. They also show that the cut-off frequency is decreased as the membrane thickness is reduced and thus the low frequency damping is improved.

FIG. 11B shows the effect of decreasing the membrane thickness on the insertion loss as a function of frequency. The insertion loss, IL, is defined as:

$$IL = 20\log\left(\frac{P_1}{P_0}\right)$$

where $P_1$ is the sound pressure level with an implemented FIV reduction system according to fourth embodiment and $P_0$ is the sound pressure level without the FIV reduction system.

The tests show an increase in insertion loss at low frequencies as the membrane thickness is reduced. This is especially prominent at frequencies below 20 Hz.

From FIG. 11 it is indicated that low frequency noise is significantly suppressed by the FIV reduction system according to fourth embodiment. The suppression is approximately 1-2 orders of magnitude in power at frequencies in the range of 10-100 Hz.

Implementations of the FIV reduction system according to fourth embodiment may include at least the following:
A single system according to FIG. 8 in which there is no gas chamber 402 and no end-stop 802. This is a passive system with a fixed resonant frequency.
A single system according to FIG. 8 in which the end-stop 802 is of a flat plate design. The end-stop 802 may be provided in a gas chamber 402. This is a passive system with a fixed resonant frequency.
A single system according to FIG. 8 in which the end-stop 802 is of a 3D design. The end-stop 802 may be provided in a gas chamber 402. This is a passive system with a fixed resonant frequency.
A single system according to FIG. 8 in which there are two or more membranes 804. The plurality of membranes 804 are arranged side by side and may be linked by one or more rigid components. The thicknesses of each of the membranes 804 may be the same or different. For the same amount of damping, this implementation may be able to withstand higher operating pressures compared to an implementation comprising only one membrane 804.
Two or more systems according to FIG. 8 in which the plurality of systems are placed in series. The membranes 804 may not have the same compliance (e.g. thickness). The plurality of systems is thus capable of damping a broad-band of low to medium frequencies. Each end-stop 802 will be designed in dependence on the compliance of the respective membrane 804.

The first to fourth embodiments of the FIV reduction system include at least the following four implementations:
1. A system according to FIG. 4, wherein there is no liquid filled cavity between the interface region 403 and the conduit 401; the interface region 403 does not comprise a membrane; and so the gas is in direct contact with the liquid in the conduit 401. The volume of the gas chamber 402 is sufficiently large to provide the required amount of FIV reduction. The system may comprise a gas supply that compensates for any reduction in gas pressure in the gas chamber 402 due to gas dissolving in the liquid.
2. A system according to FIG. 4, wherein there is no liquid filled cavity between the interface region 403 and the conduit 401; and the interface region 403 comprises a membrane that separates the gas from the liquid in the conduit 401. The volume of the gas chamber 402 is sufficiently large to provide the required amount of FIV reduction. The membrane has a high flexibility so that it does not substantially deteriorate the low frequency FIV performance.
3. A system according to FIG. 4, wherein there is no liquid filled cavity between the interface region 403 and the conduit 401; and the interface region 403 comprises a membrane that separates the gas from the liquid in the conduit 401. The system comprises a gas pressure controller that is arranged to reduce the low frequency FIV. The volume of the gas chamber 402 may be lower than that required in implementations 1) and 2) above.
4. One or more systems according to FIG. 8, wherein the compliance of the membrane reduces the low frequency FIVs in the liquid in the conduit 401. An end-plate 802 may be provided to constrain the membrane(s) such that plastic deformation is prevented.

Embodiments include one or more FIV reduction systems being provided in the flow path of a temperature controlled component. A first FIV reduction system may be provided at the inlet of the temperature controlled component and a second FIV reduction system may be provided at the outlet of the temperature controlled component. In such an arrangement, FIV in both the supply and the return path are suppressed. FIG. 12 shows how two FIV reduction systems 1201 may be provided in a flow path of a temperature controlled component 1204 according to an embodiment. The system comprises a supply manifold 1205, a return manifold 1207, a cabinet 1206, a temperature controlled component 1204, FIV reduction systems 1201 and dynamic links 1202 and 1203. The dynamic links 1202 may be across a transition between an ambient and a vacuum environment. The dynamic links 1203 are already in the vacuum environment and may, for example, isolate a sensor frame from a force frame in an EUV lithographic apparatus. In the vacuum environment, the fluid path through the temperature conditioning system has been substantially optimized. However, remote from this fluid path, significant disturbance sources are present. For instance, in the branch itself up to the supply manifold 1205 and return manifold 1207 there are restrictions, heaters, temperature sensors, etc. which may generate substantial FIV. Other sources of FIV are the cabinet 1206 (that includes a pump, etc.), the supply manifold 1205, the return manifold 1207 and vibrations on the other parallel fluid flow paths. The FIV reduction systems 1201 reduce the FIVs that propagate into the vacuum environment and thereby reach the component 1204.

A lithographic apparatus typically comprises a plurality of components that need to be temperature controlled and a supply and return path of liquid to each component is required. It is known for a lithographic apparatus to comprise a single pumping system for pumping liquid to all of the components. In such an arrangement, the amount of liquid provided to a single component may be a relatively small fraction of the liquid that is pumped by the pumping system. This can result in the temperature controlled components that are most sensitive to FIV, such as the POB, receiving a large FIV because the pump of the liquid needs to be powerful enough to supply liquid to all of the temperature controlled components.

Embodiments also include a lithographic apparatus that alternatively comprises a plurality of separate thermal conditioning systems. Each thermal conditioning system has its own pumping system for supplying liquid to just one, or some but not all, of the temperature controlled components. The pumping systems may therefore be less powerful than a single pumping system for supplying liquid to all of the components and the FIV in the liquid supplied to the most sensitive temperature controlled components is therefore reduced.

Embodiments are particularly appropriate for reducing the FIV experienced by a temperature controlled sensor frame of a POB of an EUV lithographic apparatus. However, embodiments may also be used to reduce the FIV experienced by other temperature controlled components such as a lens, a mirror or a substrate stage. Embodiments may also be used in other types of apparatus, such as a DUV lithographic apparatus.

FIG. 13 is a flowchart of a method of reducing flow induced vibrations, FIVs, in a liquid of a temperature conditioning system that controls the temperature of a component in a lithographic apparatus according to an embodiment.

In step 1301, the method starts.

In step 1303, the method comprises providing a membrane between liquid in a liquid filled cavity and a gas at a substantially ambient pressure of the region of the lithographic apparatus, so that the compliance of the membrane reduces at least the low frequency FIVs in the liquid.

In step 1305, the method ends.

Embodiments include a number of modifications to the above-described techniques.

As an alternative to what is described above shown in FIG. 1, the lithographic apparatus may be used with an alternative type of patterning device MA that imparts a pattern on the radiation beam PB when the radiation beam PB passes through the patterning device MA, rather than reflecting off the patterning device MA.

Embodiments may be used with any type of lithographic apparatus, such as a DUV apparatus.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that requires temperature control of its components.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Embodiments include the following numbered clauses:

1. A flow induced vibration, FIV, reduction system (1201) for use in a temperature conditioning system that controls the temperature of at least one component within a lithographic apparatus, the FIV reduction system (1201) comprising:
   a conduit (401) that provides a flow path for a liquid through the FIV reduction system (1201);
   a gas chamber (402) arranged to comprise a pressurised gas;
   wherein there is an interface region (403) between the gas chamber (402) and the conduit (401) that is configured such that, in use, the compliance of gas in the gas chamber (402) reduces at least the low frequency FIVs in a liquid flowing through the conduit (401).

2. The FIV reduction system (1201) according to clause 1, wherein the low frequency FIVs in the liquid are FIVs that have a frequency of 30 Hz or less.

3. The FIV reduction system (1201) according to clause 1 or 2, wherein the FIV reduction system (1201) is arranged to reduce FIVs in the liquid by reflecting and/or absorbing FIVs in the liquid.

4. The FIV reduction system (1201) according to any preceding clause, wherein interface region (403) comprises a flexible membrane arranged to separate gas in the gas chamber (402) from liquid in the conduit (401).
5. The FIV reduction system (1201) according to any of clauses 1 to 3, wherein at the interface region (403), in use, gas in the gas chamber (402) is in direct contact with liquid in the conduit (401).
6. The FIV reduction system (1201) according to any preceding clause, wherein the FIV reduction system (1201) further comprises a gas pressure control system (404) arranged to control the gas pressure in the gas chamber (402).
7. The FIV reduction system (1201) according to clause 6, wherein the gas pressure control system (404) is arranged to control the gas pressure in the gas chamber (402) so that the average gas pressure is substantially constant.
8. The FIV reduction system (1201) according to clause 6 or 7, wherein the gas pressure control system (404) is arranged to control the gas pressure in the gas chamber (402) with a low frequency response so that, in use, the gas pressure is controlled so as to reduce the low frequency FIVs in the liquid.
9. The FIV reduction system (1201) according to any preceding clause, wherein, in use, the liquid flowing through the conduit (401) is water.
10. The FIV reduction system (1201) according to any preceding clause, wherein, in use, the gas in the gas chamber (402) is air, nitrogen or carbon tetrafluoride.
11. The FIV reduction system (1201) according to any preceding clause, wherein, in use, pressure of the gas in the gas chamber (402) is in the range 1 to 10 Bara.
12. The FIV reduction system (1201) according to any preceding clause, wherein the volume of the gas in the gas chamber (402) is at least 2 mL, preferably at least 100 mL, and more preferably at least 1000 mL.
13. A temperature conditioning system arranged to control the temperature of at least one component within a lithographic apparatus, the temperature conditioning system comprising:
a component (1204) that is arranged to be temperature controlled by a liquid flowing through the component (1204); and
at least one FIV reduction system (1201) according to any preceding clause.
14. The temperature conditioning system according to clause 13, wherein the component (1204) is any of a sensor frame for a projection optics box, a lens, a mirror and a substrate stage.
15. The temperature conditioning system according to clause 13 or 14, wherein, in use, the flow of liquid through the conduit (401) of each FIV reduction system (1201) is inline with the flow of the liquid through the component (1204).
16. The temperature conditioning system according to any of clauses 13 to 15, the temperature conditioning system comprising at least one FIV reduction system (1201) on an inlet side of the component (1204) and/or at least one FIV reduction system (1201) on an outlet side of the component (1204).
17. The temperature conditioning system according to any of clauses 13 to 16, further comprising one or more flexible conduits and/or one or more rigid conduits that are each arranged to provide a flow path for liquid in the temperature conditioning system.
18. A lithographic apparatus comprising a temperature conditioning system according to any of clauses 13 to 17.

19. A method of reducing flow induced vibrations, FIVs, in a liquid of a temperature conditioning system that controls the temperature of a component (1204) in a lithographic apparatus, the method comprising:
providing an interface region (403) between gas in a gas chamber (402) and liquid in a conduit (401) so that the compliance of gas in the gas chamber (402) reduces at least the low frequency FIVs in the liquid.
20. The method according to clause 19, wherein the method is performed by a FIV reduction system (1201) according to any of clauses 1 to 12.
21. The FIV reduction system (1201) according to any of clauses 1-12, wherein the end-stop (802) comprises no through openings.
22. The FIV reduction system (1201) according to any of clauses 1-12, wherein the end-stop (802) is a flat plate substantially parallel to the plane of the membrane (804).
23. The FIV reduction system (1201) according clause 1, further comprising a bellow.
24. The FIV reduction system (1201) according clause 23, wherein the bellow comprises metal.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A passive flow induced vibration reduction system for use in a temperature conditioning system that controls the temperature of at least one component within an apparatus, the reduction system comprising:
a conduit that provides a flow path for a liquid through the reduction system;
a liquid filled cavity in fluid connection with the conduit, wherein the fluid connection is provided via one or more openings in the wall of the conduit;
a membrane configured such that it separates the liquid in the liquid filled cavity from a gas at a substantially ambient pressure and the membrane is configured such that, in use, compliance of the membrane reduces at least low frequency flow induced vibrations in the liquid flowing through the conduit; and
an end-stop located on the gas side of the membrane, wherein the end-stop is configured to limit an extent of deflection of the membrane.
2. The reduction system according to claim 1, further comprising a gas chamber configured to have the gas on the gas side of the membrane therein.
3. The reduction system according to claim 2, wherein the end-stop is located inside the gas chamber.
4. The reduction system according to claim 2, wherein a side of the gas chamber, that is an opposing end of the gas chamber to the membrane, comprises the end-stop.
5. The reduction system according to claim 1, further comprising one or more additional membranes positioned side by side to the membrane, wherein each membrane is a membrane of the same liquid filled cavity.
6. The reduction system according to claim 5, wherein each of the plurality of membranes has substantially a same compliance.
7. The reduction system according to claim 5, wherein each of the plurality of membranes has a different compliance.

8. The reduction system according to claim 1, wherein the end-stop comprises one or more through openings.

9. The reduction system according to claim 1, wherein a shape of the end-stop matches a deflection profile of the membrane.

10. A temperature conditioning system arranged to control the temperature of at least one component within an apparatus, the temperature conditioning system comprising:
- a component that is arranged to be temperature controlled by a liquid flowing through the component; and
- at least one reduction system according to claim 1.

11. The temperature conditioning system according to claim 10, wherein the component is a sensor frame for a projection optics box, a lens, a mirror, or a substrate stage.

12. The temperature conditioning system according to claim 10, wherein, in use, the flow of liquid through the conduit of each at least one reduction system is in line with the flow of the liquid through the component.

13. The temperature conditioning system according to claim 10, comprising at least one reduction system on an inlet side of the component and/or at least one reduction system on an outlet side of the component.

14. The temperature conditioning system according to claim 10, further comprising one or more flexible conduits and/or one or more rigid conduits that are each arranged to provide a flow path for liquid in the temperature conditioning system.

15. The temperature conditioning system according to claim 10, further comprising a gas chamber configured to have the gas on the gas side of the membrane therein.

16. The temperature conditioning system according to claim 15, wherein the end-stop is located inside the gas chamber.

17. The temperature conditioning system according to claim 15, wherein a side of the gas chamber, that is an opposing end of the gas chamber to the membrane, comprises the end-stop.

18. The temperature conditioning system according to claim 10, further comprising one or more additional membranes positioned side by side to the membrane, wherein each membrane is a membrane of the same liquid filled cavity.

19. The temperature conditioning system according to claim 10, wherein the end-stop comprises one or more through openings.

20. A method of reducing flow induced vibrations in a liquid of a temperature conditioning system that controls the temperature of a component in an apparatus, the method comprising:
- providing a membrane between liquid in a liquid filled cavity and a gas at a substantially ambient pressure of a region of the apparatus, so that compliance of the membrane reduces at least low frequency flow induced vibrations in the liquid;
- wherein the method is performed by the reduction system according to claim 1.

* * * * *